United States Patent
Kan et al.

(10) Patent No.: US 7,536,628 B2
(45) Date of Patent: May 19, 2009

(54) DECODING APPARATUS, DECODING METHOD AND PROGRAM

(75) Inventors: Makiko Kan, Tokyo (JP); Toshiyuki Miyauchi, Tokyo (JP); Kazuo Watanabe, Tokyo (JP); Takashi Yokokawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 509 days.

(21) Appl. No.: 11/354,000

(22) Filed: Feb. 15, 2006

(65) Prior Publication Data

US 2006/0192691 A1 Aug. 31, 2006

(30) Foreign Application Priority Data

Feb. 25, 2005 (JP) .............................. P2005-050659

(51) Int. Cl.
*H03M 13/15* (2006.01)
*H03M 13/45* (2006.01)
(52) U.S. Cl. ..................................... 714/780; 714/784
(58) Field of Classification Search ................. 714/774, 714/780, 782, 784
See application file for complete search history.

(56) References Cited

U.S. PATENT DOCUMENTS

| 7,191,376 | B2 * | 3/2007 | Yedidia | 714/751 |
| 7,334,181 | B2 * | 2/2008 | Eroz et al. | 714/801 |
| 7,376,883 | B2 * | 5/2008 | Eroz et al. | 714/758 |
| 7,415,079 | B2 * | 8/2008 | Cameron et al. | 375/340 |

OTHER PUBLICATIONS

V. Guruswami, M. Sudan, "Improved Decoding of Reed-Solomon and Algebraic-Geometry Codes", IEEE Transactions on Information Theory, vol. 45, pp. 1757-1767, 1999.

R. Koetter, A. Vardy, "Algebraic Soft-Decision decoding of Reed-Solomon Codes", IEEE Transactions on Information Theory, vol. 49, No. 11, pp. 2809-2825, 2001.

R. Koetter, J. Ma, A. Vardy, A. Ahmed, "Efficient Interpolation and Factorization in Algebraic Soft-Decision Decoding of Reed-Solomon Codes", Proceedings of ISIT2003, Yokokama, Japan, p. 365 (2003).

D. MacKay, "Good Error-Correcting Codes Based on Very Sparse Matrices", IEEE Transactions on Information Theory, vol. 45, No. 2, pp. 399-431, 1999.

Berlekamp, R. McEliece, H. van Tilborg, "On the Inherent Intractability of Certain Coding Problems", IEEE Transactions on Information Theory, vol. 24, pp. 384-386, 1978.

(Continued)

*Primary Examiner*—Stephen M Baker
(74) *Attorney, Agent, or Firm*—Finnegan, Henderson, Farabow, Garrett & Dunner, L.L.P.

(57) ABSTRACT

The present invention provides a decoding apparatus for carrying out a decoding process on a ring-R linear code. The decoding apparatus includes coded-word holding means for acquiring a coded word with a code length reduced by omission of some symbols from the coded word and for holding the coded word; known-information addition means for attaching a reliability level of each of the symbols omitted from the coded word to reduce its code length as known symbols each having a known value to the coded word held by the coded-word holding means as known information; and repetitive decoding means for repeatedly carrying out a decoding process using belief propagation on the coded word including the known information attached to the coded word by the known-information addition means.

16 Claims, 12 Drawing Sheets

OTHER PUBLICATIONS

Jing Jiang, K. R. Narayaman, Iterative Soft Decision Decoding of Reed-Solomon Codes Based On Adaptive Parity Check Matrices. Proceedings of IEEE International Symposium on Information Theory, Chicago, USA, p. 261, 2004.

* cited by examiner

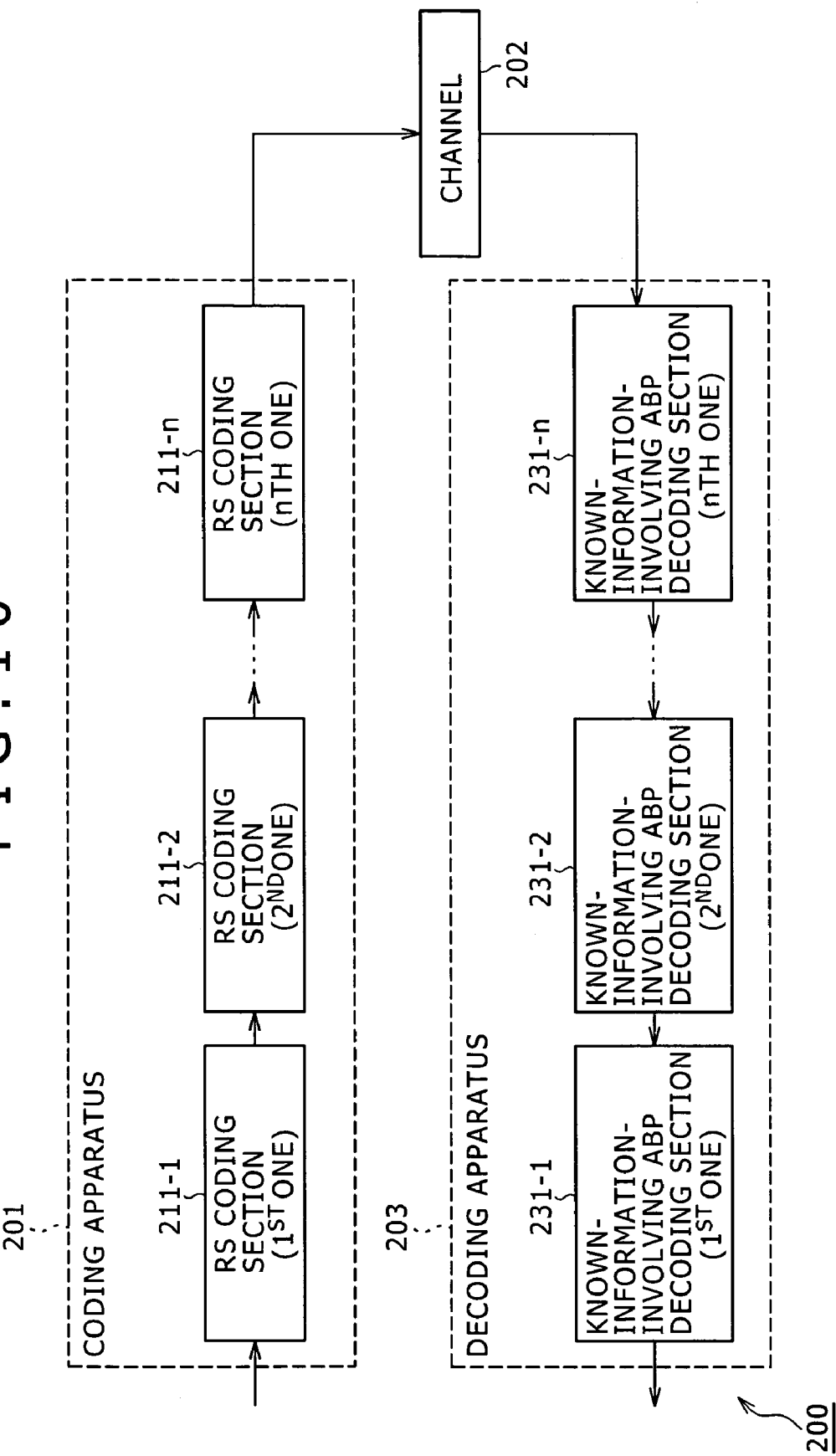

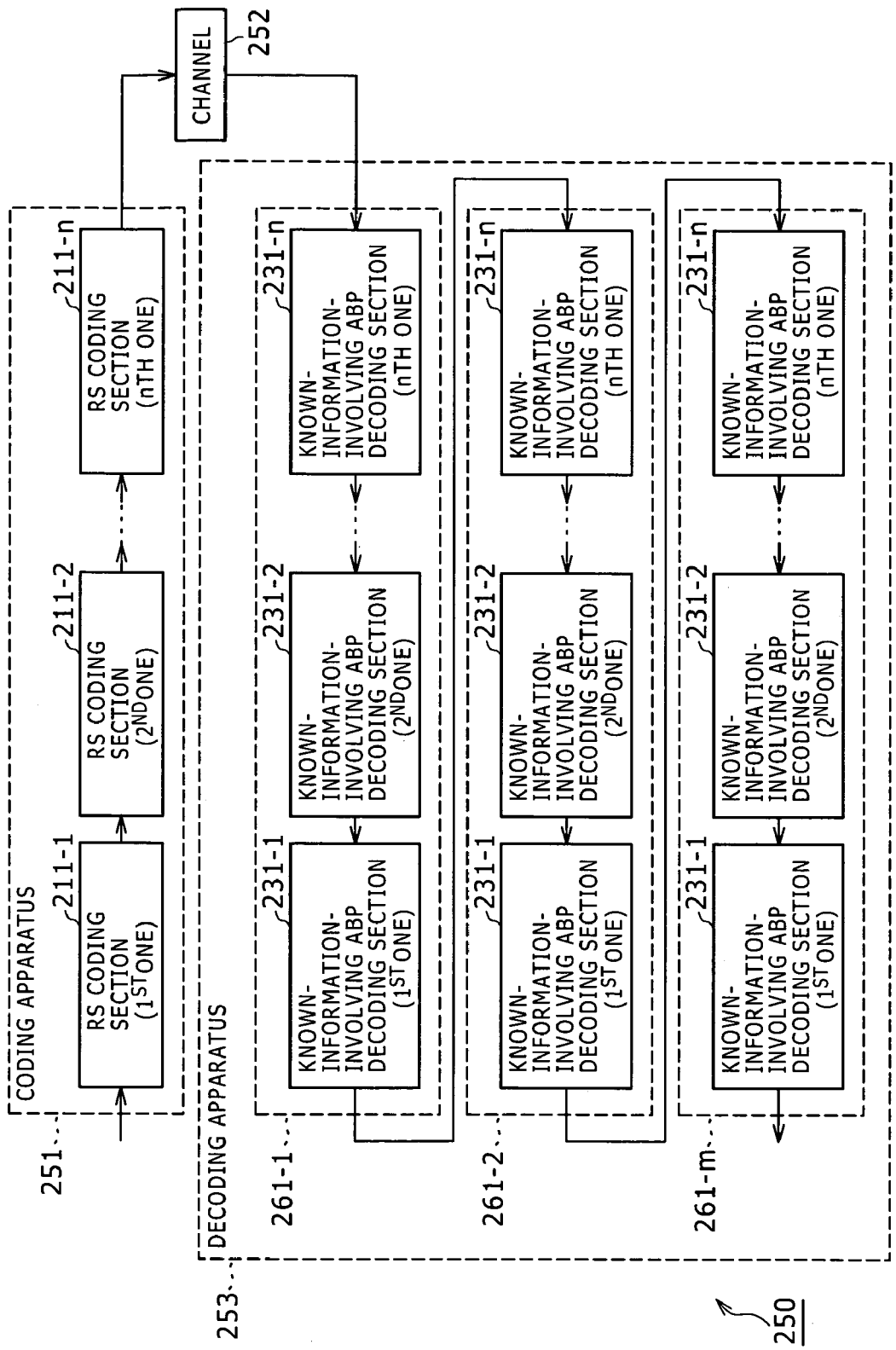

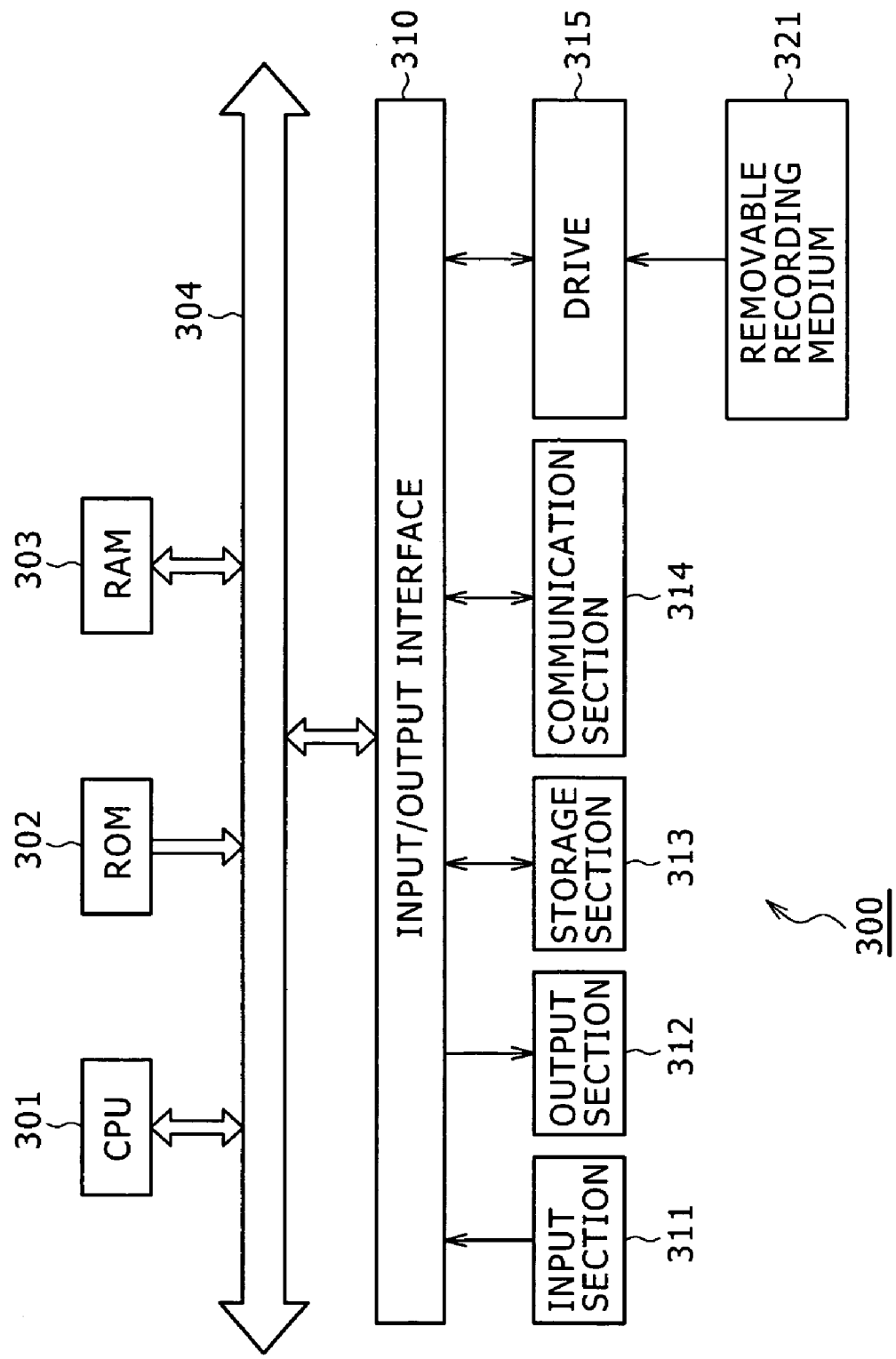

DECODING APPARATUS, DECODING METHOD AND PROGRAM

CROSS REFERENCES TO RELATED APPLICATIONS

The present invention contains subject matter related to Japanese Patent Application JP 2005-050659 filed in the Japanese Patent Office on Feb. 25, 2005, the entire contents of which being incorporated herein by reference.

BACKGROUND OF THE INVENTION

The present invention relates to a decoding apparatus, a decoding method and a program. More specifically, the present invention relates to a decoding apparatus, a decoding method, and a program capable of enhancing decoding performance in an error correction coding technology using an algebraic technique.

In the past, as a decoding method for algebraic-geometry codes such as Reed-Solomon codes or BCH (Bose-Chaudhuri-Hocquenghem) codes serving as sub-field partial codes, a method using the algebraic property of the codes and offering a good performance cost as well as a good computation cost is known.

Let us assume for example that notation n denotes a code length, notation k denotes an information length, notation GF (q) denotes a definition body where $q=p^m$ and p is a prime number and notation RS(n, k) denotes the Reed-Solomon code with a shortest distance d (n−k). In this case, a limit distance decoding method for decoding a received hard-decision word into a coded word having a shortest Hamming distance is commonly known as a method assuring correction of t erroneous symbols where notation t is a number satisfying a relation of t<d/2. In addition, a list decoding method introduced by Guruswami and Sudan assures correction of t erroneous symbols where notation t is a number satisfying a relation of $T<\sqrt{nk}$ as described in a document such as non-patent document 1. The following reference is used as non-patent document 1: V. Guruswami, M. Sudan, Improved decoding of Reed-Solomon and Algebraic-Geometry codes, IEEE Transactions on Information Theory, vol. 45, pp 1757-1767, 1999. In the following description, the list decoding method introduced by Guruswami and Sudan is referred to simply as a G-S list decoding method.

As an extended version of the G-S list decoding method, much like the G-S list decoding method, a list decoding method introduced by Koetter and Vardy as a list decoding technique applied to a received soft-decision word includes four procedures, i.e., computation of reliability of each symbol from the received information, derivation of a condition for interpolation of two variable polynomials, interpolation of the two variable polynomials and creation of a decoded-word list obtained by factorization of a polynomial obtained as a result of the interpolation. In comparison with the method introduced for received hard decision words, the list decoding method introduced by Koetter and Vardy is known to have high performance as described in non-patent document 2. The following reference is used as non-patent document 2: R. Koetter, A. Vardy, Algebraic soft-decision decoding of Reed-Solomon codes, IEEE Transactions on Information Theory, 2001. In the following description, the list decoding method introduced by Koetter and Vardy is referred to simply as a K-V list decoding method. In addition, there is also known a method for reducing the computation cost to a value in a practical range by carrying out a re-encoding process as described in non-patent document 3. The following reference is used as non-patent document 3: R. Koetter, J. Ma, A. Vardy, A. Ahmed, Efficient Interpolation and Factorization in Algebraic Soft-Decision decoding of Reed-Solomon codes, Proceedings of ISIT2003.

By the way, as a linear code, at the present time, an LDPC (Low Density Parity-check Code) draws attention as a code, which offers high performance close to limit performance by carrying out repetitive decoding processing adopting a belief propagation technique as described in non-patent document 4. The following reference is used as non-patent document 4: D. MacKay, Good Error-Correcting Codes Based on Very Sparse Matrices, IEEE Transactions on Information Theory, 1999.

It is known theoretically that, in general, the belief propagation technique adopted for decoding a LDPC code is effective only for a linear code that has a low-density parity-check matrix. In addition, transformation of the parity-check matrixes of the Reed-Solomon codes and the BCH codes into low-density parity-check matrixes raises an NP-hard problem as explained in non-patent document 5. The following reference is used as non-patent document 5: Berlekamp, R. McEliece, H. van Tilborg, on the inherent intractability of certain coding problems, IEEE Transactions on Information Theory, vol. 24, pp 384-386, 1978.

As is obvious from the above description, it is difficult to apply a decoding method adopting the belief propagation technique to the Reed-Solomon codes and the BCH codes.

In the year of 2004, however, by using a parity-check matrix completing a diagonalization operation in accordance with reliability of a received word, Narayanan et al. were capable of effectively applying a decoding method adopting the belief propagation technique to the Reed-Solomon codes, the BCH codes and linear codes having a parity-check matrix other than the low-density parity check matrix as disclosed in non-patent document 6. The following reference is used as non-patent document 6: Jing Jiang, K. R. Narayaman, Soft Decision Decoding of RS Codes Using Adaptive Parity Check Matrices. Proceedings of IEEE International Symposium on Information theory, 2004. The effectively applicable decoding method adopting the belief propagation technique is referred to as an ABP (Adaptive Belief Propagation) decoding method, which is described as follows.

Let us assume for example a linear code C having a parity check matrix H including 3 rows and 6 columns as shown in Eq. (1) given below, a code length n of 6, an information length k of 3, and an encoding rate of 1/2.

$$H = \begin{pmatrix} 1 & 0 & 1 & 0 & 0 & 1 \\ 1 & 1 & 0 & 1 & 0 & 1 \\ 0 & 1 & 1 & 1 & 1 & 1 \end{pmatrix} \quad (1)$$

In this case, a code space C is expressed by Eq. (2) as follows.

$$C=\{c=(c_1,c_2,\ldots,c_6), c_1,c_2,\ldots,c_6 \in 0,1 | H \cdot c^t = 0\} \quad (2)$$

Let us assume that, after passing through a channel such as an AWGN (Adaptive White Gaussian Noise) channel following a BPSK (Binary Phase Shift Keying) process, a coded word is received by a receiver as a received word shown by Eq. (3) given as follows.

$$r=(r_1,r_2,\ldots,r_6)=(0.4,1,2,0.1,0.7,0.3,0.7) \quad (3)$$

In such a case, a decoding apparatus employed in the receiver carries out decoding processing with a flow thereof represented by a flowchart, which is explained by referring to FIG. 1 as follows.

The flowchart begins with a step S1 at which the decoding apparatus recognizes the reliability order of the received word. To put it concretely, the decoding apparatus regards the magnitude of the absolute value of each received symbol on the right side of Eq. (3) representing the equation of the received word as the level of the reliability of the symbol and, then, sets an order of the magnitudes of the absolute values as the order of reliability levels of the received symbols in the received word. That is to say, the decoding apparatus assigns order numbers each enclosed in a circle to received symbols in an increasing order with the smallest order number associated with the smallest magnitude of the absolute values of the received symbols as shown in Eq. (4) to result in an increasing order of reliability levels. As will be described later, in accordance with one of predetermined algorithms, the increasing order of reliability levels is adopted as an order of priority levels.

$$r = \begin{matrix} ③ & ⑤ & ① & ④ & ② & ⑥ \\ (0.4, & 1.2, & 0.1, & 0.7, & 0.3, & 0.7) \end{matrix} \qquad (4)$$

Then, at the next step S2, in accordance with a predetermined rule, the decoding apparatus rearranges the received symbols each having an order number assigned thereto in order to transform the existing priority order of the symbols into a new priority order for the next outer iteration loop from the step S2 to a step S9. For example, the existing priority order of the symbols is transformed into a new priority order, which is the increasing reliability order described above. As will be described later, as many rules different from each other as outer-side repetitions executed in repetitive decoding processing are prepared in advance and, each time one of the outer-side repetitions is executed, a different method according to a selected one of the prepared rules is adopted.

Then, at the next step S3 after the step of transforming the priority order into a new order, the decoding apparatus carries out a diagonalization operation on the parity-check matrix H in an execution order according to the new priority order. Let us assume for example that the priority order is transformed into a new priority order, which is the increasing reliability order described above. Thus, the new priority order starts with a symbol having the lowest level of reliability to be followed by symbols having gradually increasing levels of reliability. In this case, the decoding apparatus carries out a diagonalization operation on the parity-check matrix H in an execution order starting from a column corresponding to the symbol having the lowest level of reliability to be followed by columns corresponding to symbols having gradually increasing levels of reliability.

Since the new priority order starts with a symbol having the lowest level of reliability, in the typical case of the priority order shown in Eq. (4) as an order of increasing levels of reliability, a column included in the parity-check matrix H as a column corresponding to a symbol having the lowest level of reliability is column 3. A column corresponding to a symbol having a reliability level higher than the reliability level of column 3 is column 5. Columns each corresponding to a symbol having a reliability level higher than the reliability level of column 5 are columns 4 and 6. Finally, a column corresponding to a symbol having the highest level of reliability is column 2. Thus, the decoding apparatus carries out a diagonalization operation on the parity-check matrix H in accordance with these levels of priority.

That is to say, first of all, the decoding apparatus carries out a basic deformation operation on the parity-check matrix H with column 3 taken as the important one. To put it concretely, the decoding apparatus transforms the parity check matrix H into a matrix expressed by Eq. (5) by taking an exclusive logical sum of columns 1 and 3 and using the sum as a substitute for column 3 to give column 3 of '100' as follows:

$$H = \begin{pmatrix} 1 & 0 & 1 & 0 & 0 & 1 \\ 1 & 1 & 0 & 1 & 0 & 1 \\ 1 & 1 & 0 & 1 & 1 & 0 \end{pmatrix} \qquad (5)$$

Then, the decoding apparatus carries out a basic deformation operation on the parity-check matrix H with column 5 taken as the important one. To put it concretely, the decoding apparatus transforms the parity check matrix H into a matrix expressed by Eq. (6) by swapping rows 2 and 3 with each other to give column 5 of '010' as follows:

$$H = \begin{pmatrix} 1 & 0 & 1 & 0 & 0 & 1 \\ 1 & 1 & 0 & 1 & 1 & 0 \\ 1 & 1 & 0 & 1 & 0 & 1 \end{pmatrix} \qquad (6)$$

Subsequently, the decoding apparatus carries out a basic deformation operation on the parity-check matrix H with column 1 taken as the important one. To put it concretely, the decoding apparatus transforms the parity check matrix H into a parity check matrix $H_{new}$ expressed by Eq. (7) by taking an exclusive logical sum of rows 1 and 3 and using the sum as a substitute for row 1 as well as taking an exclusive logical sum of rows 2 and 3 and using the sum as a substitute for row 2 to give column 1 of '001' as follows:

$$H_{new} = \begin{pmatrix} 0 & 1 & 1 & 1 & 0 & 0 \\ 0 & 0 & 0 & 0 & 1 & 1 \\ 1 & 1 & 0 & 1 & 0 & 1 \end{pmatrix} \qquad (7)$$

It is to be noted that if a specific column subjected to an attempt to carry out a diagonalization operation is linearly dependent on a column completing a diagonalization operation before the specific column, the decoding apparatus makes an attempt to carry out a diagonalization operation on a column of the next level of priority by keeping the specific column as it is. In this way, the decoding apparatus carries out a rank diagonalization operation on the parity check matrix H to produce the new parity check matrix $H_{new}$.

Then, at the next step S4, the decoding apparatus carries out a belief propagation process by using the obtained new parity check matrix $H_{new}$. The belief propagation process is carried out as a preparation to update the reliability level of each symbol at the following step S5.

FIG. 2 is a diagram showing Thanner graphs corresponding to the parity check matrix $H_{new}$ expressed by Eq. (7). A belief propagation process is implemented by letting a message go and come along edges of the Thanner graphs. In the diagram of FIG. 2, variable nodes are nodes corresponding to columns of a matrix. The variable nodes 11 to 16 shown in FIG. 2 correspond to the columns of the parity check matrix $H_{new}$. On the other hand, check nodes are nodes corresponding to rows of a matrix. The check nodes 21 to 23 shown in FIG. 2 correspond to the rows of the parity check matrix $H_{new}$.

In the following description, notations i and j each denote a natural number. Notation $R_{i,j}$ denotes a message going from the ith variable node to the jth variable node. Notation $Q_{i,j}$ denotes a message going from the jth check node to the ith check node. Notation $J(i)$ denotes a set of indexes for check nodes linked to the ith variable node. Notation $I(j)$ denotes a set of indexes for variable nodes linked to the jth check node.

In this case, updating equations of messages $R_{i,j}$ and $Q_{i,j}$ are expressed by Eqs. (8) and (9) respectively as follows.

$$R_{i,j} = 2\tanh^{-1}\left(\prod_{l \in I(j)\setminus i} \tanh(Q_{l,j}/2)\right) \quad (8)$$

$$Q_{i,j} = r_i + \theta \sum_{l \in J(i)\setminus j} R_{i,l} \quad (9)$$

A coefficient $\theta$ in Eq. (9) is a convergence coefficient known as a vertical step damping factor. The coefficient $\theta$ has a value in the range $0<\theta\leq 1$. The received symbol $y_j$ is set as the initial value of the message $Q_{i,j}$.

Extrinsic information $\Lambda_j^x$ is updated in accordance with Eq. (10) as follows.

$$[\Lambda_i^x = \sum_{l \in J(i)} R_{i,l} \quad (10)$$

That is to say, at a step S5 of the flowchart shown in FIG. 1, the decoding apparatus computes an LLR (Log Likelihood Ratio) $\Lambda_q$ of every coded symbol in accordance with Eq. (11) as follows:

$$\Lambda_i^q = r_i + \alpha_1 \Lambda_i^x \quad (11)$$

The LLR of a symbol is used as the reliability level of the symbol.

A coefficient $\alpha 1$ in Eq. (11) is a convergence coefficient known as an adaptive belief propagation damping factor. The coefficient $\alpha 1$ has a value in the range $0<\alpha 1\leq 1$.

After computing the LLRs, the flow of the processing carried out by the decoding apparatus goes on to a step S6 at which the reliability-level order of the computed LLRs is recognized. To put it concretely, the decoding apparatus regards the magnitude of the absolute value of each computed LLR as the level of the reliability of the LLR in order to recognize the order of reliability levels. As will be described later, the LLRs are updated repeatedly till a predetermined condition is satisfied. The order of reliability levels is recognized to be used as an execution order for the diagonalization operation of the parity check matrix H in the next updating inner iteration loop from the step S3 to a step S8.

Then, at the next step S7, the decoding apparatus decodes the computed (updated) LLRs in order to obtain a decoded word. As a decoding technique, it is possible to adopt one of methods such as a hard decision decoding method, a limit distance decoding method and a K-V list decoding method. Subsequently, at the next step S8, the decoding apparatus produces a result of determination as to whether or not an inner-side repetitive decoding termination condition SC1 determined in advance is satisfied.

The operation of the step S5 to update LLRs on the basis of the belief propagation is carried out repeatedly till the repetitive decoding termination condition SC1 prepared in advance is satisfied. The decoding apparatus uses the reliability of each LLR updated at the step S5 on the basis of the belief propagation to re-update the LLRs at the step S5 in the next inner iteration loop. To put it concretely, the decoding apparatus takes the magnitude of the absolute value of each obtained LLR as a level of reliability at the step S6 and again carries out a diagonalization operation of the parity check matrix at the step S3 in an execution order starting with a column corresponding to a symbol having a lowest level of reliability as described before by referring to Eqs. (5) to (7). Then, the decoding apparatus re-updates the LLRs at the step S5 on the basis of a new belief propagation process carried out at the step S4. In addition, every time the decoding apparatus updates the LLRs, the decoding apparatus carries out a decoding process at the step S7 by using the updated LLRs. That is to say, the decoding apparatus carries out the decoding process repeatedly. This repetitive decoding processing is referred to as inner-side repetitive decoding processing. The decoding apparatus carries out the inner-side repetitive decoding processing repeatedly till the determination result produced at the step S8 indicates that the repetitive decoding termination condition SC1 prepared in advance is satisfied.

That is to say, if the determination result produced in the process carried out at the step S8 of the flowchart shown in FIG. 1 indicates that the inner-side repetitive decoding termination condition SC1 determined in advance is not satisfied, the flow of the processing carried out by the decoding apparatus goes back to the step S3 to repeat the processes of this step and the subsequent steps. If the determination result produced in the process carried out at the step S8 of the flowchart shown in FIG. 1 indicates that the inner-side repetitive decoding termination condition SC1 determined in advance is satisfied, on the other hand, the flow of the processing carried out by the decoding apparatus goes on to the step S9 cited above.

At the step S9, the decoding apparatus produces a result of determination as to whether or not an outer-side repetitive decoding termination condition SC2 determined in advance is satisfied. If the result of the determination indicates that the outer-side repetitive decoding termination condition SC2 determined in advance is not satisfied, the flow of the processing carried out by the decoding apparatus goes back to the step S2 to repeat the processes of this step and the subsequent steps.

That is to say, as an initial value of the priority order of the diagonalization operation carried out on columns of the parity check matrix H, the decoding apparatus prepares beforehand initial values according to a plurality of different methods each used for setting a priority order other than an order based on the aforementioned reliability levels of received symbols. Then, by adopting one of the prepared methods, the decoding apparatus carries out the inner-side repetitive decoding processes of the steps S3 to S8 concurrently or sequentially a plurality of times, that is, the decoding apparatus repeats the inner-side repetitive decoding processing. The repeated execution of the inner-side repetitive decoding processing of the steps S3 to S8 is referred to as the outer-side repetitive decoding processing, which also includes the step S2 for selecting the method to determine the basis of the priority order and the step S9. That is to say, the decoding apparatus carries out the outer-side repetitive decoding processing repeatedly till the determination result produced at the step S9 indicates that the outer-side repetitive decoding termination condition SC2 determined in advance is satisfied.

As an example, the following description explains typical repetitive decoding termination conditions SC for a case in which the linear code serving as an object of processing is the Reed-Solomon code.

Let us assume for example that notation N denotes a predetermined maximum repetition count representing the maximum number of repetitions and the hard decision result of $\Lambda_q$ is d (=d1, d2, ..., d6). The hard decision result $d_i$ is expressed by Eq. (12) as follows.

$$d_i=1 \text{ for } \Lambda_i^q>0 \text{ or}$$

$$di=0 \text{ for } \Lambda_i^q\leq 0 \quad (12)$$

In this case, the decoding apparatus may typically adopt a repetitive decoding termination condition SC, which requires that the product of the parity check matrix H and the hard decision result d shall be zero (that is, H×d=0), the repetition count t shall be equal to or greater than the predetermined maximum repetition count N (that is, t≧N) or both the conditions of (H×d=0) and (t≧N) shall be satisfied. In this case, the repetitive decoding termination condition SC can be used as the inner-side repetitive decoding termination condition SC1 or the outer-side repetitive decoding termination condition SC2.

As an alternative, the decoding apparatus may also adopt a repetitive decoding termination condition SC, which requires that a limit distance decoding process shall have been successful, the repetition count t shall be equal to or greater than the predetermined maximum repetition count N (that is, t≧N) or both the conditions of a successful limit distance decoding process and (t≧N) shall be satisfied. Also in this case, the repetitive decoding termination condition SC can be used as the inner-side repetitive decoding termination condition SC1 or the outer-side repetitive decoding termination condition SC2.

As another alternative, the decoding apparatus may also adopt a repetitive decoding termination condition SC, which requires that at least the k-v list decoding process has been successful or the repetition count t shall be equal to or greater than the predetermined maximum repetition count N (that is, t≧N). Also in this case, the repetitive decoding termination condition SC can be used as the inner-side repetitive decoding termination condition SC1 or the outer-side repetitive decoding termination condition SC2.

If the determination result produced in a process carried out at the step S9 after the outer-side repetitive decoding processing described above has been completed indicates that the outer-side repetitive decoding termination condition SC2 is satisfied, the decoding apparatus ends the execution of the decoding processing.

SUMMARY OF THE INVENTION

For example, the code length of the Reed-Solomon code in an error correction system adopted as the standard of communication or the like is set for the information length of information that needs to be actually communicated. In addition, in many cases, shortened codes of the primitive Reed-Solomon code to be coded at a code length of $2^n$ are used.

However, a technique adopting the conventional adaptive belief propagation like the one described above is a decoding technique using reliability of only a received word. This technique does not keep up with a case of handling an uncoded portion eliminated from a shortened coded word as a portion including symbols exempted from a coding process. In addition, even if a symbol of a portion included in a coded word is a known symbol, the technique does not make an effort to use the symbol as known information.

Such an error correction system has a problem of the need to find out a higher-performance decoding method capable of reducing the number of error generations.

Addressing the problems described above, inventors of the present invention have devised a decoding method capable of displaying higher decoding performance by lowering a decoder-error generation probability in repetitive decoding processing using reliabilities updated by adoption of an adaptive belief propagation technique.

A decoding apparatus provided by the present invention is characterized in that the decoding apparatus has:

coded-word holding means for acquiring a coded word with a code length reduced by omission of some symbols from the coded word and for holding the coded word;

known-information addition means for attaching a reliability level of each of the symbols omitted from the coded word to reduce its code length as known symbols each having a known value to the coded word held by the coded-word holding means as known information; and repetitive decoding means for repeatedly carrying out a decoding process using belief propagation on the coded word including the known information attached to the coded word by the known-information addition means.

It is possible to provide the decoding apparatus with a configuration further having known-information setting means for setting the known information to be attached by the known-information addition means to the coded word.

It is possible to provide a configuration in which the known-information setting means assigns a sufficiently high level of reliability to each known symbol.

It is possible to provide the decoding apparatus with a configuration further including known-information holding means for holding the known information set by the known-information setting means. In this case, the known-information addition means attaches the known information held by the known-information holding means to the coded word.

It is possible to provide a configuration in which an LLR (Log Likelihood Ratio) is used as the reliability cited above.

The repetitive decoding means may include:

first reliability-order recognition means for recognizing an order of reliability levels of symbols included in a coded word held in the coded-word holding means as a coded word including known information attached to the coded word by the known-information addition means;

diagonalization means for carrying out a diagonalization process on a parity check matrix on the basis of information on a reliability-level order recognized by the first reliability-order recognition means;

belief propagation means for updating a message by carrying out a belief propagation process through use of a parity check matrix already subjected to a diagonalization process carried out by the diagonalization means;

log likelihood ratio computation means for computing log likelihood ratios by using a message updated in a belief propagation process carried out by the belief propagation means as symbols of a coded word;

second reliability-order recognition means for recognizing an order of reliability levels of the log likelihood ratios computed by the log likelihood ratio computation means;

decoding means for carrying out a decoding process by using the log likelihood ratios computed by the log likelihood ratio computation means;

first determination means for producing a first result of determination as to whether or not a first condition for termination of the repeatedly performed decoding processing is satisfied;

second determination means for producing a second result of determination as to whether or not a second condition for termination of the repeatedly performed decoding processing is satisfied; and decoding control means for executing control to repeatedly carry out a process of the first reliability-order recognition means to recognize an order of reliability levels of symbols included in a coded word, the diagonalization process of the diagonalization means to diagonalize a parity check matrix, the belief propagation process of the belief propagation means, a process of the log likelihood ratio computation means to compute log likelihood ratios, a process of the second reliability-order recognition means to recognize an order of reliability levels of computed log likelihood ratios and the decoding process of the decoding means till a predetermined process termination condition is satisfied as evidenced by the first determination result produced by the first determination means and the second determination result produced by the second determination means.

It is possible to provide a configuration in which the diagonalization means carries out a diagonalization process sequentially on columns of a parity check matrix on a priority basis in an execution order starting from the column corresponding to a symbol included in a received coded word as a symbol with a lowest level of reliability.

It is possible to provide a configuration in which the diagonalization means arranges columns of a parity check matrix into a column array starting with a column corresponding to a symbol included in a received coded word as a symbol with a lowest level of reliability, rearranges some of the columns included in the column array in accordance with a predetermined method and carries out a diagonalization process on the columns of the parity check matrix in an execution order according to a result of the rearrangement.

It is possible to provide a configuration in which the diagonalization means prepares a plurality of methods each to be used as a method for determining an initial value of a priority order of columns composing the parity check matrix to be subjected to a diagonalization process. Then, the diagonalization means selects a method different from previously selected ones among the prepared methods every time the priority order is initialized.

It is possible to provide a configuration in which the diagonalization means carries out a hard-decision diagonalization process by using log likelihood ratios computed by the log likelihood ratio computation means.

It is possible to provide a configuration in which the diagonalization means carries out a diagonalization process by using algebraic-geometry codes or codes of the same type as the algebraic-geometry codes in a finite field F $(q=p^m)$ where p is a prime number as linear codes and taking reliability levels obtained as a result of an updating process carried out a plurality of times as an input.

It is possible to provide a configuration in which, for algebraic-geometry codes, which can be the Reed-Solomon codes, the BCH codes or codes of the same type as the Reed-Solomon codes or the BCH codes, the diagonalization means carries out a hard-decision list diagonalization process based on a Sudan, Gurusuwami-Sudan or other algorithm by taking reliability levels obtained as a result of an updating process carried out a plurality of times as an input.

It is possible to provide a configuration in which, for algebraic-geometry codes, which can be the Reed-Solomon codes, the BCH codes or codes of the same type as the Reed-Solomon codes or the BCH codes, the diagonalization means carries out a multiplicity-setting and soft-decision list decoding processes based on a Koetter-Vardy or other algorithm by taking reliability levels obtained as a result of an updating process carried out a plurality of times as an input.

A decoding method provided by the present invention is characterized in that the decoding method has the steps of:

acquiring a coded word with a code length reduced by omission of some symbols from the coded word and holding the coded word in coded-word holding means;

attaching a reliability level of each of the symbols omitted from the coded word to reduce its length as known symbols each having a known value to the coded word held in the coded-word holding means in a process carried out at the coded-word holding step as known information; and repeatedly carrying out a decoding process using belief propagation on the coded word including the added known information attached to the coded word in a process carried out at the known-information addition step.

A program provided by the present invention is characterized in that the decoding method has the steps of:

acquiring a coded word with a code length reduced by omission of some symbols from the coded word and holding the coded word in coded-word holding means;

attaching a reliability level of each of the symbols omitted from the coded word to reduce its length as known symbols each having a known value to the coded word held in the coded-word holding means in a process carried out at the coded-word holding step as known information; and repeatedly carrying out a decoding process using belief propagation on the coded word including the added known information attached to the coded word in a process carried out at the known-information addition step.

In accordance with the decoding apparatus, the decoding method and the program, which are provided by the present invention as described above:

a coded word with a code length reduced by omission of some symbols from the coded word is acquired and held in coded-word holding means;

reliability levels of some known symbols omitted from the coded word to reduce the length of the coded word as known symbols each having a known value are attached to the coded word held in the coded-word holding means as known information; and a decoding process is carried out repeatedly by adopting a belief propagation technique on the coded word including known information attached to the coded word.

In accordance with the present invention, it is possible to implement an error correction coding technology adopting an algebraic technique. In particular, the decoder-error generation probability can be lowered and higher decoding performance can thus be obtained.

BRIEF DESCRIPTION OF THE DRAWINGS

FIG. 10 is an explanatory block diagram showing a further typical configuration of an error correction system according to the embodiment of the present invention;

FIG. 11 is an explanatory block diagram showing a still further typical configuration of an error correction system according to the embodiment of the present invention; and FIG. 12 is a diagram showing a typical configuration of a personal computer according to the embodiment of the present invention.

DETAILED DESCRITION OF THE PREFERRED EMBODIMENTS

Before preferred embodiments of the present invention are explained, relations between disclosed inventions and the embodiments are explained in the following comparative description. It is to be noted that, even if there is an embodiment described in this specification but not included in the following comparative description as an embodiment corresponding to an invention, such an embodiment is not to be interpreted as an embodiment not corresponding to an invention. Conversely, an embodiment included in the following comparative description as an embodiment corresponding to a specific invention is not to be interpreted as an embodiment not corresponding to an invention other than the specific invention.

In addition, the following comparative description is not to be interpreted as a comprehensive description covering all inventions disclosed in this specification. In other words, the following comparative description by no means denies existence of inventions disclosed in this specification but not included in claims as inventions for which a patent application is filed. That is to say, the following comparative description by no means denies existence of inventions to be included in a separate application for a patent, included in an amendment to this specification or attached in the future.

Figure 3:
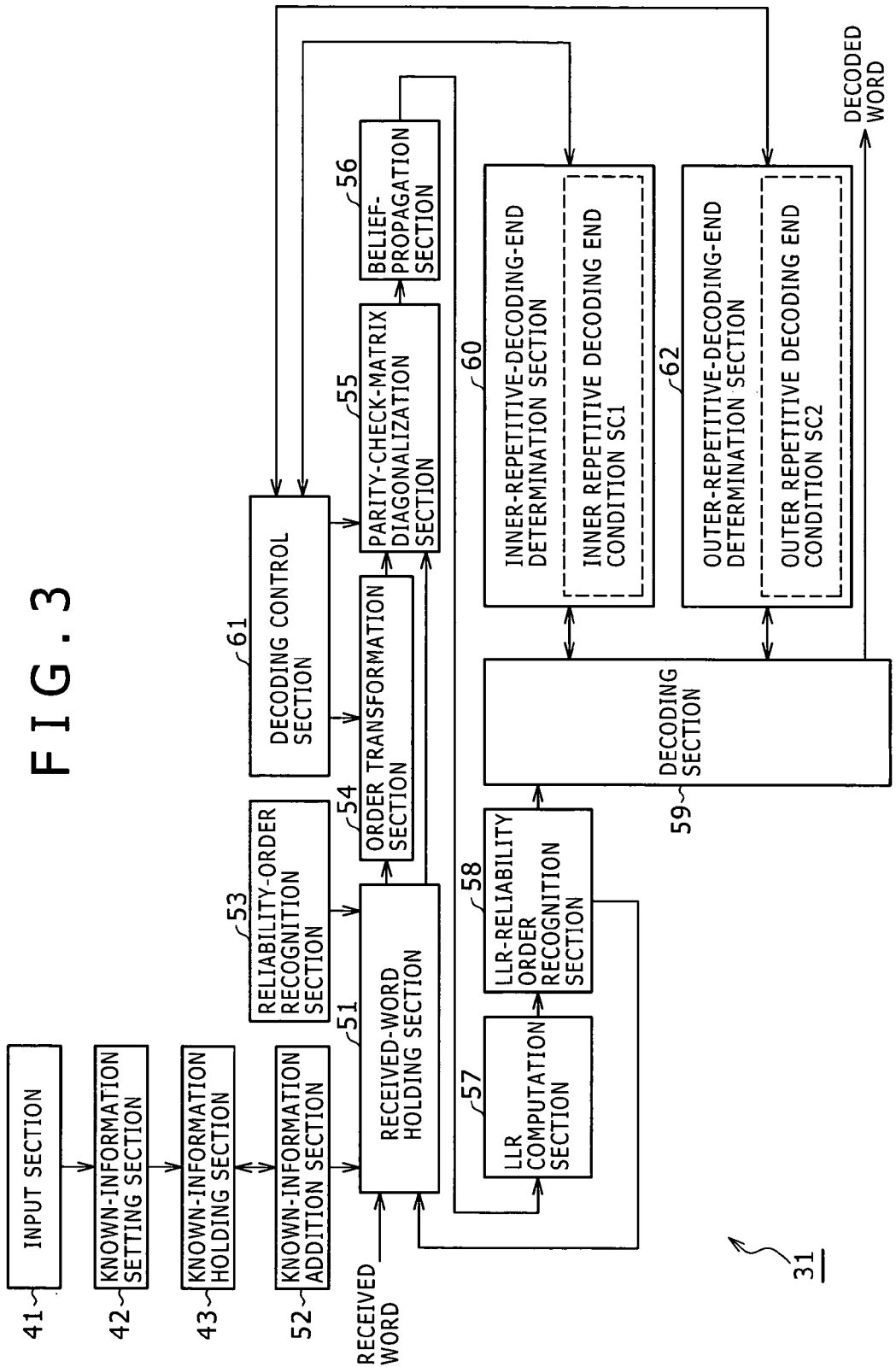
FIG. 3 is a block diagram showing a typical configuration of a decoding apparatus according to an embodiment of the present invention.

A decoding apparatus (such as a known-information-including ABP decoding apparatus shown in FIG. 3) provided by the present invention as a decoding apparatus for carrying out a decoding process on a ring-R linear codes is characterized in that the decoding apparatus has:

coded-word holding means (such as a received-word holding section shown in FIG. 3) for acquiring a coded word with a code length reduced by omission of some symbols from the coded word and for holding the coded word;

known-information addition means (such as a known-information addition section shown in FIG. 3) for attaching a reliability level of each of the symbols omitted from the coded word to reduce its code length as known symbols each having a known value to the coded word held by the coded-word holding means as known information; and repetitive decoding means (such as a reliability order recognition section and outer-side repetitive-decoding termination determination section shown in FIG. 3) for repeatedly carrying out a decoding process using belief propagation on the coded word including the known information attached to the coded word by the known-information addition means.

It is possible to provide the decoding apparatus with a configuration further having known-information setting means (such as a known-information setting section shown in FIG. 3) for setting the known information to be attached by the known-information addition means to the coded word.

It is possible to provide a configuration in which the known-information setting means assigns a sufficiently high level of reliability to each known symbol.

It is possible to provide the decoding apparatus with a configuration further including known-information holding means (such as a known-information holding section shown in FIG. 3) for holding the known information set by the known-information setting means. In this case, the known-information addition means attaches the known information held by the known-information holding means to the coded word.

It is possible to provide a configuration in which an LLR (Log Likelihood Ratio) is used as the level of reliability cited above.

The repetitive decoding means may include:

first reliability-order recognition means (such as a reliability recognition section shown in FIG. 3) for recognizing an order of reliability levels of symbols included in a coded word held in the coded-word holding means as a coded word including known information attached to the coded word by the known-information addition means;

diagonalization means (such as a parity-check matrix diagonalization section shown in FIG. 3) for carrying out a diagonalization process on a parity check matrix on the basis of information on a reliability-level order recognized by the first reliability-order recognition means;

belief propagation means (such as a belief propagation section shown in FIG. 3) for updating a message by carrying out a belief propagation process through use of a parity check matrix already subjected to a diagonalization process carried out by the diagonalization means;

log likelihood ratio computation means (such as an LLR computation section shown in FIG. 3) for computing log likelihood ratios by using a message updated in a belief propagation process carried out by the belief propagation means as symbols of a coded word;

second reliability-order recognition means (such as an LLR reliability recognition section shown in FIG. 3) for recognizing an order of reliability levels of the log likelihood ratios computed by the log likelihood ratio computation means;

decoding means (such as a decoding section shown in FIG. 3) for carrying out a decoding process by using the log likelihood ratios computed by the log likelihood ratio computation means;

first determination means (such as an inner-side repetitive-decoding termination determination section shown in FIG. 3) for producing a first result of determination as to whether or not a first condition for termination of the repeatedly performed decoding processing is satisfied;

second determination means (such as the outer-side repetitive-decoding termination determination section shown in FIG. 3) for producing a second result of determination as to whether or not a second condition for termination of the repeatedly performed decoding processing is satisfied; and decoding control means (such as a decoding control section shown in FIG. 3) for executing control to repeatedly carry out a process of the first reliability-order recognition means to recognize an order of reliability levels of symbols included in a coded word, the diagonalization process of the diagonalization means to diagonalize a parity check matrix, the belief propagation process of the belief propagation means, a process of the log likelihood ratio computation means to compute log likelihood ratios, a process of the second reliability-order recognition means to recognize an order of reliability levels of computed log likelihood ratios and the decoding process of the decoding means till a predetermined process termination condition is satisfied as evidenced by the first determination result produced by the first determination means and the second determination result produced by the second determination means.

Figure 6:
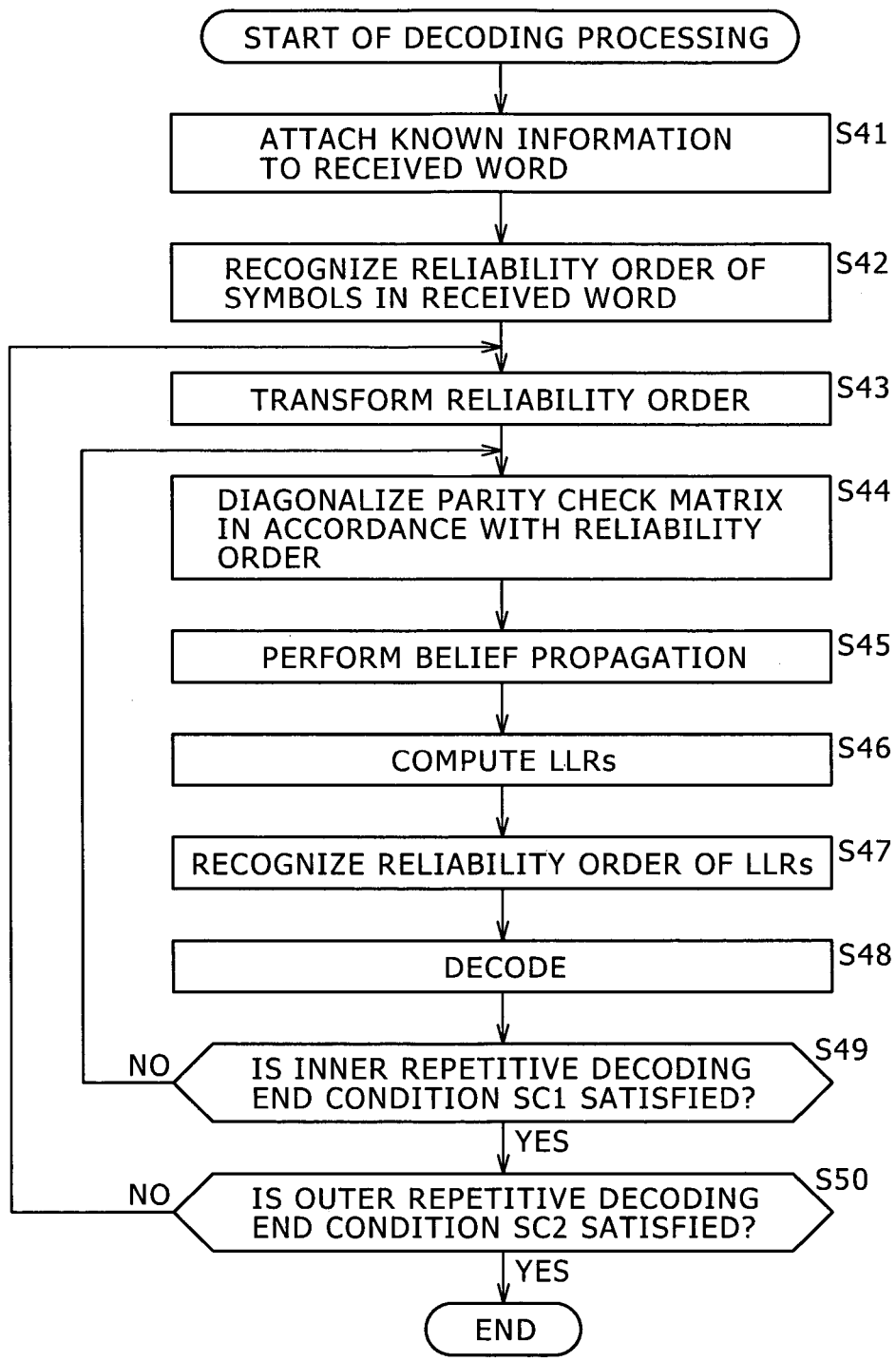
FIG. 6 shows a flowchart referred to in explaining the flow of decoding processing carried out by the decoding apparatus included in the configuration shown in FIG. 3.

It is possible to provide a configuration in which the diagonalization means carries out a diagonalization process (such as a process carried out at a step S44 of a flowchart shown in FIG. 6) sequentially on columns of a parity check matrix on a priority basis in an execution order starting from the column corresponding to a symbol included in a received coded word as a symbol with a lowest level of reliability.

It is possible to provide a configuration in which the diagonalization means arranges columns of a parity check matrix into a column array starting with a column corresponding to a symbol included in a received coded word as a symbol with a lowest level of reliability, rearranges some of the columns included in the column array in accordance with a predetermined method and carries out a diagonalization process on the columns of the parity check matrix in an execution order according to a result of the rearrangement (such as a process carried out at a step S43 of the flowchart shown in FIG. 6).

It is possible to provide a configuration in which the diagonalization means prepares a plurality of methods each to be used as a method for determining an initial value of a priority order of columns composing the parity check matrix to be subjected to a diagonalization process and, then, the diagonalization means selects a method different from previously selected ones among the prepared methods every time the priority order is initialized (in the process like the one carried out at the step S43 of the flowchart shown in FIG. 6).

It is possible to provide a configuration in which the diagonalization means carries out a hard-decision diagonalization process (such as a process carried out at a step S48 of the flowchart shown in FIG. 6) by using log likelihood ratios computed by the log likelihood ratio computation means.

It is possible to provide a configuration in which the diagonalization means carries out a diagonalization process (such as the process carried out at the step S48 of the flowchart shown in FIG. 6) by using algebraic-geometry codes or codes of the same type as the algebraic-geometry codes in a finite field F ($q=p^m$) where p is a prime number as linear codes and taking reliability levels obtained as a result of an updating process carried out a plurality of times as an input.

It is possible to provide a configuration in which, for algebraic-geometry codes, which can be the Reed-Solomon codes, the BCH codes or codes of the same type as the Reed-Solomon codes or the BCH codes, the diagonalization means carries out a hard-decision list diagonalization process (such as the process carried out at the step S48 of the flowchart shown in FIG. 6) based on a Sudan, Gurusuwami-Sudan or other algorithm by taking reliability levels obtained as a result of an updating process carried out a plurality of times as an input.

It is possible to provide a configuration in which, for algebraic-geometry codes, which can be the Reed-Solomon codes, the BCH codes or codes of the same type as the Reed-Solomon codes or the BCH codes, the diagonalization means carries out a multiplicity-setting and soft-decision list decoding processes (such as the process carried out at the step S48 of the flowchart shown in FIG. 6) based on a Koetter-Vardy or other algorithm by taking reliability levels obtained as a result of an updating process carried out a plurality of times as an input.

A decoding method provided by the present invention is characterized in that the decoding method has:

a coded-word holding step (such as a step S24 of a flowchart shown in FIG. 5) of acquiring a coded word with a code length reduced by omission of some symbols from the coded word and holding the coded word in coded-word holding means;

a known-information addition step (such as a step S41 of the flowchart shown in FIG. 6) of attaching a reliability level of each of the symbols omitted from the coded word to reduce its length as known symbols each having a known value to the coded word held in the coded-word holding means in a process carried out at the coded-word holding step as known information; and a repetitive decoding step (such as steps S43 and S50 of the flowchart shown in FIG. 6) of repeatedly carrying out a decoding process using belief propagation on the coded word including the added known information attached to the coded word in a process carried out at the known-information addition step.

In the embodiment, which is a typical embodiment, steps of a program provided by the present invention are the same as the steps of the decoding method provided by the present invention as described above.

The embodiment of the present invention is explained by referring to diagrams as follows.

FIG. 3 is a block diagram showing a typical configuration of a decoding apparatus to which the present invention is applied.

A known-information ABP (Adaptive Belief Propagation) decoding apparatus 31 shown in FIG. 3 is a decoding apparatus of an error correction system to which a shortened coded word is transmitted. The known-information-involving ABP decoding apparatus 31 receives the shortened coded word including transmitted symbols as a received word and attaches an omitted portion of the coded word to the received word to generate a complete coded word. The omitted portion is symbols, which are not coded and not transmitted to the known-information-involving ABP decoding apparatus 31. The known-information-involving ABP decoding apparatus 31 then decodes the complete coded word by adoption of a technique using adaptive belief propagation. As will be described later in detail, the known-information-involving ABP decoding apparatus 31 actually attaches the reliability level of the uncoded portion including symbols to the received coded word to generate an entire coded word and decodes the entire coded word by adoption of a technique using the adaptive belief propagation. Strictly speaking, the known-information-involving ABP decoding apparatus 31 attaches the reliability levels of symbols included in the uncoded portion exempted from a coding process to the received values (the reliability levels) of transmitted symbols to generate an entire coded word and decodes the entire coded word by adoption of a technique using the adaptive belief propagation.

At that time, a correct value of each symbol included in the received coded word is an unknown value. By the correct value, a value prior to transmission of the coded word is implied. On the other hand, each of the uncoded symbols attached to the received coded word has a predetermined value such as zero. That is to say, the correct value (or the value prior to transmission of the coded word) of every uncoded symbol attached to the received coded word is a known value. For this reason, in the following description, a symbol originally included in a received coded word is referred to as an unknown symbol whereas an uncoded symbol, the reliability of which is attached to a received coded word, is referred to as a known symbol. In addition, the reliability of a known symbol is referred to as known information in some cases. As described above, the reliability of a known symbol is information attached to a received coded word.

It is to be noted that the magnitude of the absolute value of an unknown symbol represents the level of reliability of the unknown symbol. In the following description, the level of reliability is also referred to simply as the reliability in some cases for the sake of simplicity. That is to say, in the case of a positive value, the larger the absolute value of the symbol, the greater the likelihood exhibited by the value as likelihood of being 1. In the case of a negative value, on the other hand, the larger the absolute value of the symbol, the greater the likelihood exhibited by the value as likelihood of being zero. Since the correct value of a known symbol is known, on the other hand, the reliability of the known symbol is basically set at a sufficiently high value.

As shown in FIG. 3, the known-information-involving ABP decoding apparatus 31 has an input section 41, a known-information setting section 42, a known-information holding section 43, a received-word holding section 51, a known-information addition section 52, a reliability-order recognition section 53, an order transformation section 54, a parity-check-matrix diagonalization section 55, a belief-propagation section 56, an LLR (Log Likelihood Ratio) computation section 57, an LLR-reliability-order recognition section 58, a decoding section 59, an inner-repetitive-decoding-end determination section 60, a decoding control section 61 and an outer-repetitive-decoding-end determination section 62.

Including an input device such as a keyboard, external input terminals and other components, the input section 41 is a unit for receiving information on each known symbol as input information from an external source supplying the information prior to the start of a decoding process and supplying the information to the known-information setting section 42. To put it concretely, the input section 41 receives the input information such as the number of bits included in each known symbol, the level of reliability assigned to the known symbol and the assignment method, supplying the input information to the known-information setting section 42. It is to be noted that, in place of the input section 41, a storage section implemented by a recording medium such as a semiconductor memory can be provided and the information described above as the information on known symbols is stored in the storage section in advance. Then, when the information on known symbols is required by the known-information setting section 42, the known-information setting section 42 reads out the information from the storage section.

The known-information setting section 42 is a unit for setting known information to be attached to a received coded word on the basis of information received from the input section 41 as the information on known symbols and supplying the known information to the known-information holding section 43. Including a recording medium such as a semiconductor memory, the known-information holding section 43 is a unit for temporarily holding the known information received from the known-information setting section 42 and, if necessary, supplying the known information to the known-information addition section 52.

The received-word holding section 51 is a unit for accepting a received coded word including unknown symbols from a source external to the known-information-involving ABP decoding apparatus 31 and temporarily holding the coded word. The known-information addition section 52 attaches the known information to the coded word stored in the received-word holding section 51 and temporarily stores back the coded word and the known information in the received-word holding section 51. The reliability-order recognition section 53 reads out the coded word including the attached known information from the received-word holding section 51, and assigns a level of priority to each symbol included in the coded word including the attached known information by adoption of a predetermined method based on aforementioned reliability levels of symbols. As described earlier, in this case, the reliability level of a symbol is defined as the magnitude of the absolute value of the symbol. The reliability-order recognition section 53 then stores back information on the priority levels assigned to symbols in the received-word holding section 51. The received-word holding section 51 is also used for storing an updated reliability level of each symbol and the order of reliability levels or information on priority levels. The updated levels of reliability and the order of updated reliability levels are received from the LLR-reliability-order recognition section 58 and used as updates of already stored levels of reliability and an already stored order of reliability levels. As described before, as the reliability level of a symbol, the LLR of the symbol is used next time in place of the aforementioned absolute value of the symbol. Then, the received-word holding section 51 supplies the information on the priority levels assigned to symbols to the order transformation section 54 or the parity-check-matrix diagonalization section 55.

The known-information addition section 52 is thus a unit for acquiring the known information from the known-information holding section 43, adding the known information to the received coded word held in the received-word holding section 51 and storing back the coded word including the attached known information in the received-word holding section 51.

The reliability-order recognition section 53 is thus a unit for reading out the coded word including the attached known information from the received-word holding section 51 and assigning a level of reliability to each symbol included in the coded word including the attached known information by adoption of a predetermined method based on levels of reliability. To put it in detail, for example, the reliability-order recognition section 53 sets a level of reliability for a symbol in proportion to the magnitude of the absolute value of the symbol. That is to say, the larger the absolute value of the symbol, the higher the reliability level set for the symbol, or the smaller the absolute value of a symbol, the lower the reliability level set for the symbol. Then, the reliability-order recognition section 53 assigns a highest level of priority to a symbol with a lowest level of reliability or a symbol with a smallest absolute value and a lowest level of priority is assigned to a symbol with a highest level of reliability or a symbol with a largest absolute value in such a way that, the lower the reliability level of a symbol or the smaller the absolute value of the symbol, the higher the priority level assigned to the symbol. Conversely speaking, the higher the reliability level of a symbol or the larger the absolute value of the symbol, the lower the priority level assigned to the symbol.

Controlled by the decoding control section 61, the order transformation section 54 is a unit for transforming assignment of priority levels to symbols of a coded word received from the received-word holding section 51 as the coded word including the attached known information into other assignment of priority levels by adoption of a predetermined algorithm and rearranging the symbols on a priority basis. That is to say, the order transformation section 54 transforms assignment of priority levels to symbols of the coded word including the attached known information into other assignment of priority levels by adoption of a method selected by the decoding control section 61 among a plurality of predetermined methods prepared in advance and supplies the result of the transformation to the parity-check-matrix diagonalization section 55.

Controlled by the decoding control section 61, the parity-check-matrix diagonalization section 55 is a unit for carrying out a diagonalization process on a parity check matrix H to generate a new parity check matrix $H_{new}$ on the basis of priority levels of the symbols included in the coded word including the attached known information. In this case, the levels of priority can be either priority levels received from the order transformation section 54 as priority levels obtained as a result of the priority-level transformation process performed by the order transformation section 54 or priority levels received from the received-word holding section 51. Then, the parity-check-matrix diagonalization section 55 supplies the new parity check matrix $H_{new}$ to the belief-propagation section 56.

The belief-propagation section 56 is a unit for carrying out a belief propagation process by using the new parity check matrix $H_{new}$ received from the parity-check-matrix diagonalization section 55, updating a message and supplying the updated message to the LLR computation section 57. On the basis of the message received from the belief-propagation section 56, the LLR computation section 57 computes an LLR of each symbol to be used for updating the present LLR. The LLR computation section 57 then supplies the updated LLR of each symbol to the LLR-reliability-order recognition section 58. The LLR-reliability-order recognition section 58 is a unit for recognizing an order of reliability levels of LLRs updated by the LLR computation section 57. The LLR-reliability-order recognition section 58 supplies the updated LLRs and the recognized order of reliability levels of LLRs to the received-word holding section 51 and the decoding section 59. The updated LLRs and the recognized order of reliability levels of LLRs are supplied to the received-word holding section 51 to be used in the processes carried out by the parity-check-matrix diagonalization section 55, the belief-propagation section 56, the LLR computation section 57 and the LLR-reliability-order recognition section 58 as described above.

The decoding section 59 is a unit for decoding each LLR received from the LLR-reliability-order recognition section 58 in order to generate a decoded word. It is to be noted that, as a decoding method, the decoding section 59 may adopt a limit distance decoding technique, a hard-decision decoding technique, a K-V list decoding technique or any other decoding technique. Every time a decoding process is carried out once, the decoding section 59 supplies the result of the decoding process to the inner-repetitive-decoding-end determination section 60. As an inner-side repetitive termination condition SC1 and an outer-side repetitive termination condition SC2 are both satisfied, the decoding section 59 ends the repetition of the decoding process and supplies a decoded word obtained as a result of the last decoding process to a recipient apparatus outside the known-information-involving ABP decoding apparatus 31.

The inner-repetitive-decoding-end determination section 60 is a unit for determining whether or not to terminate inner-side repetitive decoding processing carried out repeatedly by the decoding section 59. The inner-repetitive-decoding-end determination section 60 has an embedded recording medium such as a semiconductor memory. The embedded recording medium is used for storing the inner-side repetitive termination condition SC1 in advance. The inner-repetitive-decoding-end determination section 60 also has an embedded inner counter for counting the number of times the inner-side repetitive decoding processing has been carried out repeatedly so far by the decoding section 59. To put it concretely, on the basis of information including an inner count value representing the number of times the inner-side repetitive decoding processing has been carried out repeatedly so far by the decoding section 59 and a decoded-word value output by the decoding section 59 as a result of the decoding process carried out by the decoding section 59, the inner-repetitive-decoding-end determination section 60 produces a result of determination as to whether or not the inner-side repetitive termination condition SC1 stored in advance in the embedded recording medium is satisfied and supplies the result of the determination to the decoding control section 61. If the result of the determination indicates that the inner-side repetitive decoding processing carried out repeatedly by the decoding section 59 is to be terminated, the decoding control section 61 controls the inner-repetitive-decoding-end determination section 60 to reset the inner count value of the embedded inner counter.

The decoding control section 61 is a unit for controlling components employed in the known-information-involving ABP decoding apparatus 31 so as to repeatedly carry out repetitive decoding processing adopting the adaptive belief propagation technique on a received coded word including known information.

For example, on the basis of a determination result received from the inner-repetitive-decoding-end determination section 60, the decoding control section 61 controls the order transformation section 54, the parity-check-matrix diagonalization section 55, the inner-repetitive-decoding-end determination section 60, the outer-repetitive-decoding-end determination section 62 or another component.

To put it concretely, if the determination result received from the inner-repetitive-decoding-end determination section 60 indicates that the inner-side repetitive decoding processing carried out repeatedly by the decoding section 59 is not to be terminated, for example, the decoding control section 61 controls the parity-check-matrix diagonalization section 55 to acquire priority levels of symbols from the received-word holding section 51 and carry out a diagonalization process on the parity check matrix on the basis of the priority levels.

If the determination result received from the inner-repetitive-decoding-end determination section 60 indicates that the inner-side repetitive decoding processing carried out repeatedly by the decoding section 59 is to be terminated, on the other hand, the decoding control section 61 controls the order transformation section 54 to acquire priority levels of symbols from the received-word holding section 51, transform assignment of the priority levels to the symbols into other assignment of the priority levels to the symbols on the basis of a method different from the method adopted so far and supply the other assignment to the parity-check-matrix diagonalization section 55. Then, the decoding control section 61 controls the parity-check-matrix diagonalization section 55 to carry out a diagonalization process on the parity check matrix on the basis of the other priority-level assignment received from the order transformation section 54. Subsequently, the decoding control section 61 controls the inner-repetitive-decoding-end determination section 60 to reset the inner count value of the embedded inner counter. Thereafter, the decoding control section 61 controls the outer-repetitive-decoding-end determination section 62 to count the number of times the outer-side repetitive decoding processing has been carried out repeatedly so far by the decoding section 59 and produce a result of determination as to whether or not to terminate the outer-side repetitive decoding processing carried out repeatedly by the decoding section 59.

In addition, the decoding control section 61 executes other kinds of control. For example, the decoding control section 61 controls the outer-repetitive-decoding-end determination section 62 on the basis of the determination result received from the outer-repetitive-decoding-end determination section 62.

To put it concretely, for example, if the determination result received from the outer-repetitive-decoding-end determination section 62 indicates that the outer-side repetitive decoding processing carried out repeatedly by the decoding section 59 is to be terminated, the decoding control section 61 controls the outer-repetitive-decoding-end determination section 62 to reset the count value of an outer counter embedded in the outer-repetitive-decoding-end determination section 62 and inform the decoding section 59 that the outer-side repetitive decoding processing is to be terminated. Then, the decoding control section 61 controls the components employed in the known-information-involving ABP decoding apparatus 31 to terminate the outer-side repetitive decoding processing.

The outer-repetitive-decoding-end determination section 62 is a unit for determining whether or not to terminate the aforementioned outer-side repetitive decoding processing carried out repeatedly by the decoding section 59. The outer-repetitive-decoding-end determination section 62 has an embedded recording medium such as a semiconductor memory. The embedded recording medium is used for storing the outer-side repetitive termination condition SC2 in advance. The outer-repetitive-decoding-end determination section 62 also has an embedded outer counter for counting the number of times the outer-side repetitive decoding processing has been carried out repeatedly so far by the decoding section 59. To put it concretely, on the basis of information including an outer count value representing the number of times the outer-side repetitive decoding processing has been carried out repeatedly so far by the decoding section 59 and a decoded-word value output by the decoding section 59 as a result of the decoding process carried out by the decoding section 59, the outer-repetitive-decoding-end determination section 62 produces a result of determination as to whether or not the outer-side repetitive termination condition SC2 stored in advance in the embedded recording medium is satisfied and supplies the result of the determination to the decoding control section 61.

For example, every time an outer-side decoding process is terminated, the decoding control section 61 controls the outer-repetitive-decoding-end determination section 62 to increment the outer count value representing the number of times the outer-side repetitive decoding processing has been carried out repeatedly so far by the decoding section 59. The outer-repetitive-decoding-end determination section 62 produces a result of determination as to whether or not the outer-side repetitive termination condition SC2 stored in advance in the embedded recording medium is satisfied and supplies the result of the determination to the decoding control section 61. If the result of the determination indicates that the outer-side repetitive decoding processing carried out repeatedly by the decoding section 59 is to be terminated, the decoding control section 61 controls the outer-repetitive-decoding-end determination section 62 to reset the outer count value of the embedded outer counter, notifying the decoding section 59 that the inner-side repetitive termination condition SC1 and the outer-side repetitive termination condition SC2 are both satisfied. In addition, the outer-repetitive-decoding-end determination section 62 also controls the decoding section 59 to supply a decoded word to a recipient external to the known-information-involving ABP decoding apparatus 31.

As described above, the known-information-involving ABP decoding apparatus 31 attaches reliability levels of known symbols as known information to the values of symbols included in a received coded word and decodes the entire coded word including the added known information. Let us assume for example that $2^3$ (=8) symbols are reduced to six symbols as a result of a shortening Reed-Solomon coding process carried out to generate a coded word, which is then supplied to the known-information-involving ABP decoding apparatus 31. In this case, the known-information addition section 52 employed in the known-information-involving ABP decoding apparatus 31 attaches reliability levels of the two known symbols as known information to the values of the six symbols included in the received coded word.

Figure 2:
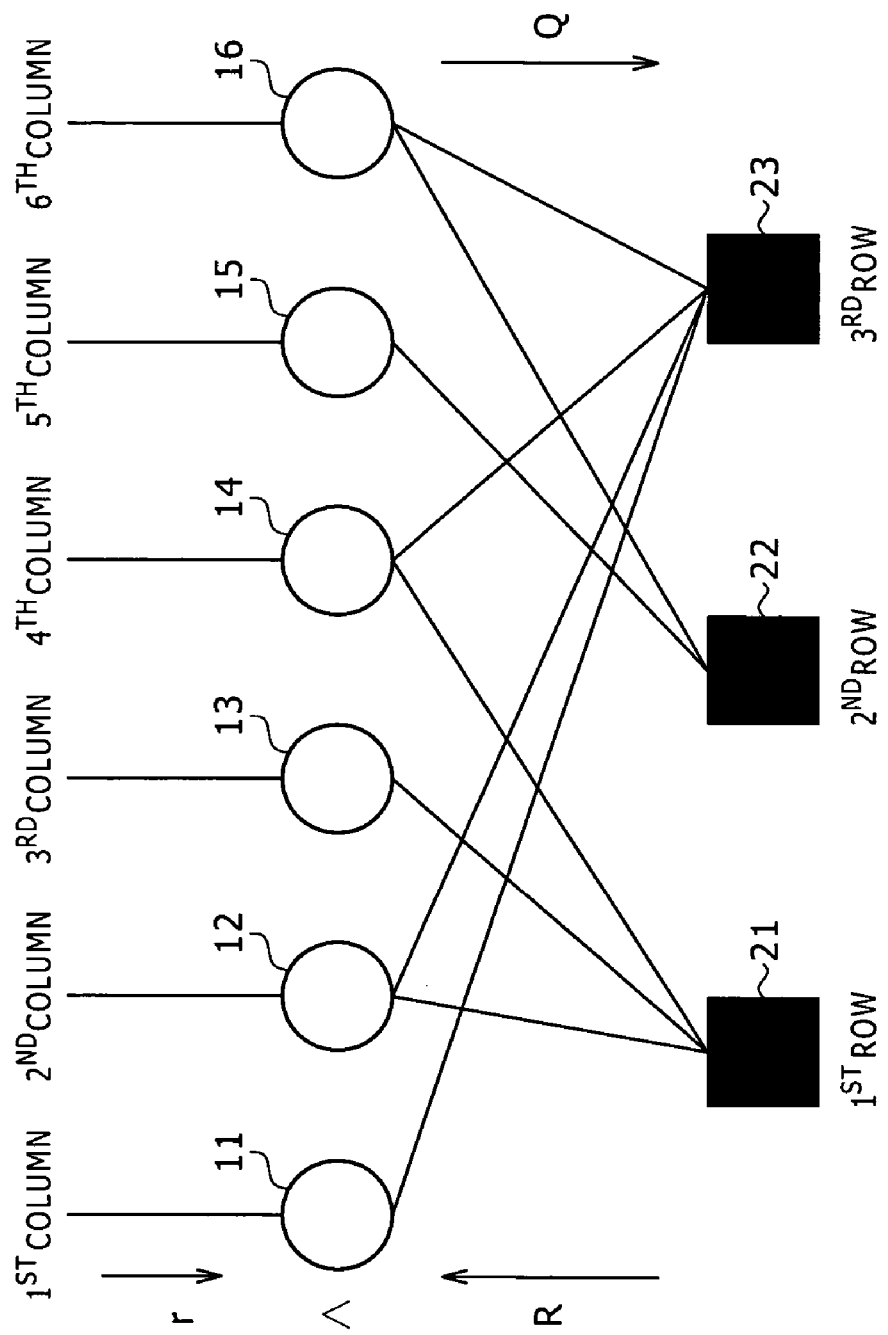
FIG. 2 is a diagram showing Thanner graphs corresponding to the conventional decoding processing.
Figure 4:
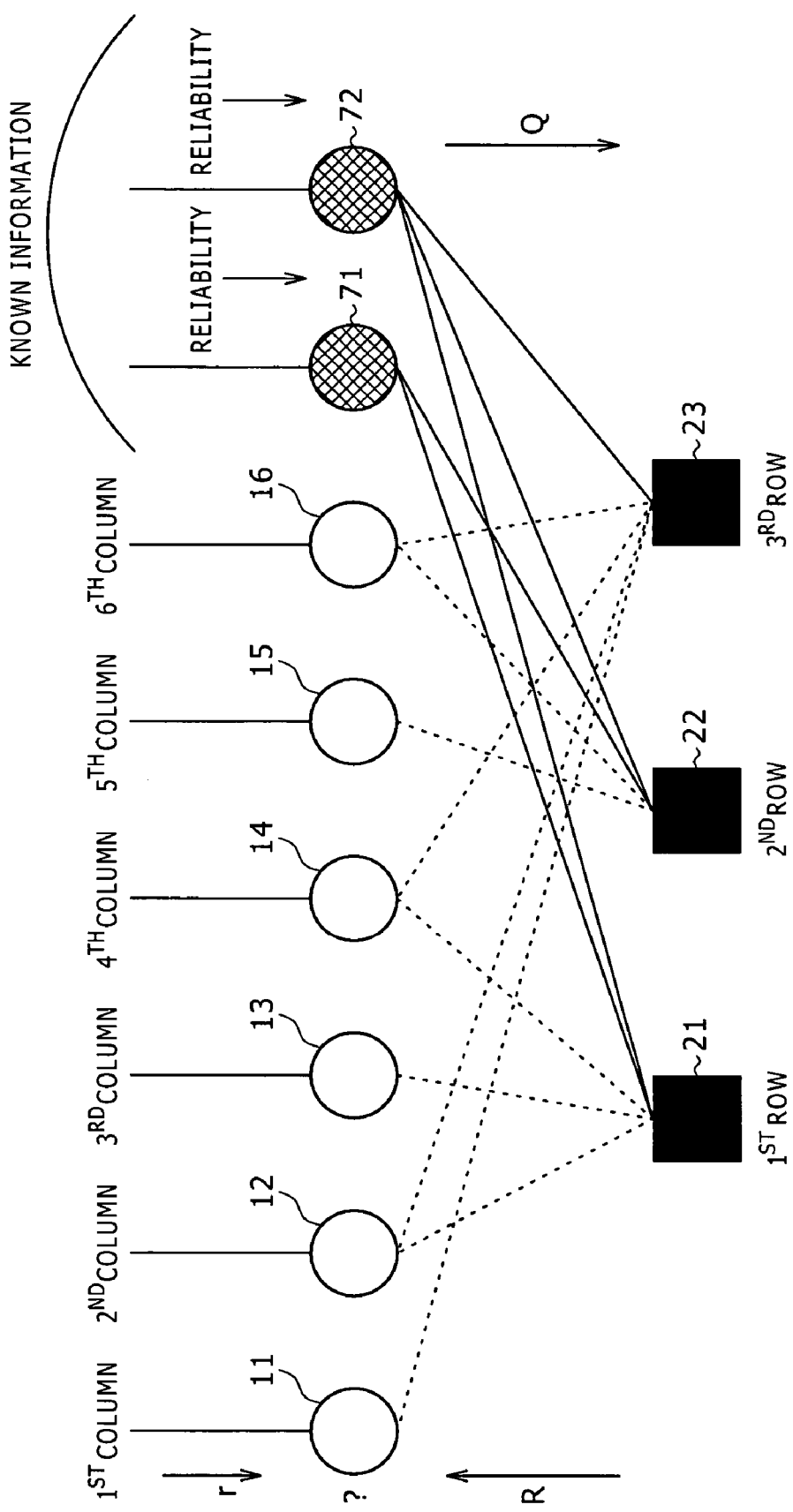
FIG. 4 is a diagram showing Thanner graphs corresponding to decoding processing carried out in accordance with the embodiment of the present invention.

At that time, in place of the Thanner graphs shown in FIG. 2, Thanner graphs shown in FIG. 4 are obtained. As shown in FIG. 4, variable nodes 71 and 72 for the known information are attached to variable nodes 11 to 16. Since known information is attached to the received coded word, the number of parity-check columns is also changed to include additional new columns corresponding to the attached variable nodes 71 and 72.

Thus, in addition to edges each shown as a dashed line as the edges of the Thanner graphs shown in FIG. 2, edges each shown as a solid line are attached for the variable nodes 71 and 72. The belief-propagation section 56 lets messages go and come along all the edges including these newly attached edges.

Next, the flow of processing carried out by the known-information-involving ABP decoding apparatus 31 as described above is explained as follows.

Figure 5:
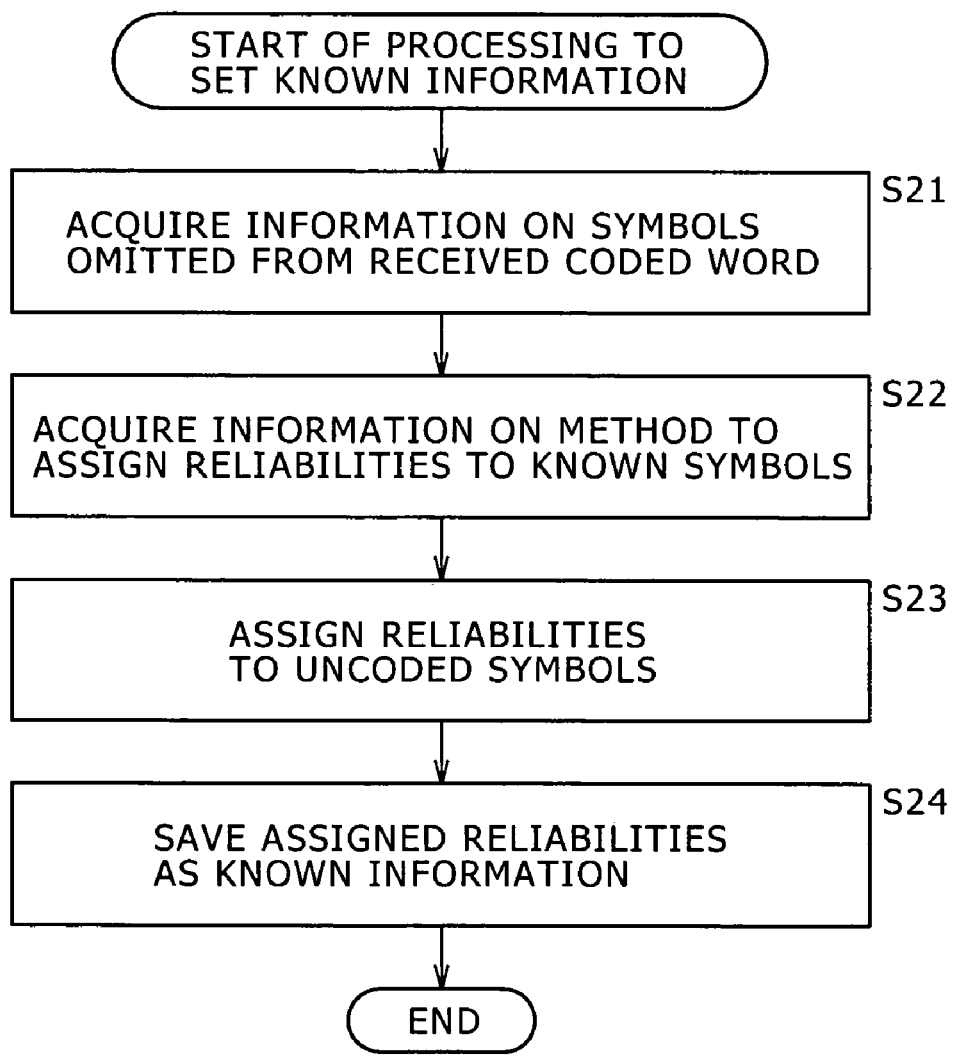
FIG. 5 shows a flowchart referred to in explaining the flow of processing carried out by a decoding apparatus included in the configuration shown in FIG. 3 to set known information.

First of all, known-information setting processing carried out prior to decoding processing is explained by referring to a flowchart shown in FIG. 5.

When the known-information setting processing is started typically as requested by an instruction given by the user, initially, at a step S21, the input section 41 acquires information on symbols omitted from a received coded word as known information. That is to say, the input section 41 receives or acquires input information on known symbols, which are an uncoded portion omitted from a received coded word transmitted by a coding apparatus through a transmission line or a portion omitted from the word and not transmitted along with the word. Typically, the input section 41 receives information such as the number of known symbols or the number of bits and the value of each known symbol from an external apparatus or the user. The input section 41 accepts the received information.

Then, at the next step S22, the input section 41 acquires information supplied to the known-information-involving ABP decoding apparatus 31 in the same way as the data acquired in the process carried out at the step S21 as information on a method of assigning levels of reliability to the known symbols. For example, the input section 41 acquires information on a method of assigning levels (or values) of reliability to the known symbols as information used for determining which level of reliability is to be assigned to each of the known symbols.

Then, at the next step S23, on the basis of the information acquired by the input section 41 in the process carried out at the step S21 as information on the known symbols and on the basis of the information acquired in the process carried out at the step S22 as information on the a method of assigning levels of reliability to the known symbols, the known-information setting section 42 assigns a level of reliability to each of the known symbols. Subsequently, at the next step S24, the known-information holding section 43 holds the reliability levels assigned to the known symbols as known information and terminates the execution of the known-information setting processing.

Next, the decoding processing for decoding a coded word by using the known information described above is explained by referring to a flowchart shown in FIG. 6.

When a coded word is supplied to the known-information-involving ABP decoding apparatus 31 and stored in the received-word holding section 51 employed in the known-information-involving ABP decoding apparatus 31, the decoding processing is started. When the decoding processing is started, initially, at a step S41, the known-information addition section 52 acquires the known information stored in the known-information holding section 43, adding the known information to the received coded word stored in the received-word holding section 51 and stores back the coded word including the attached known information in the received-word holding section 51.

Figure 1:
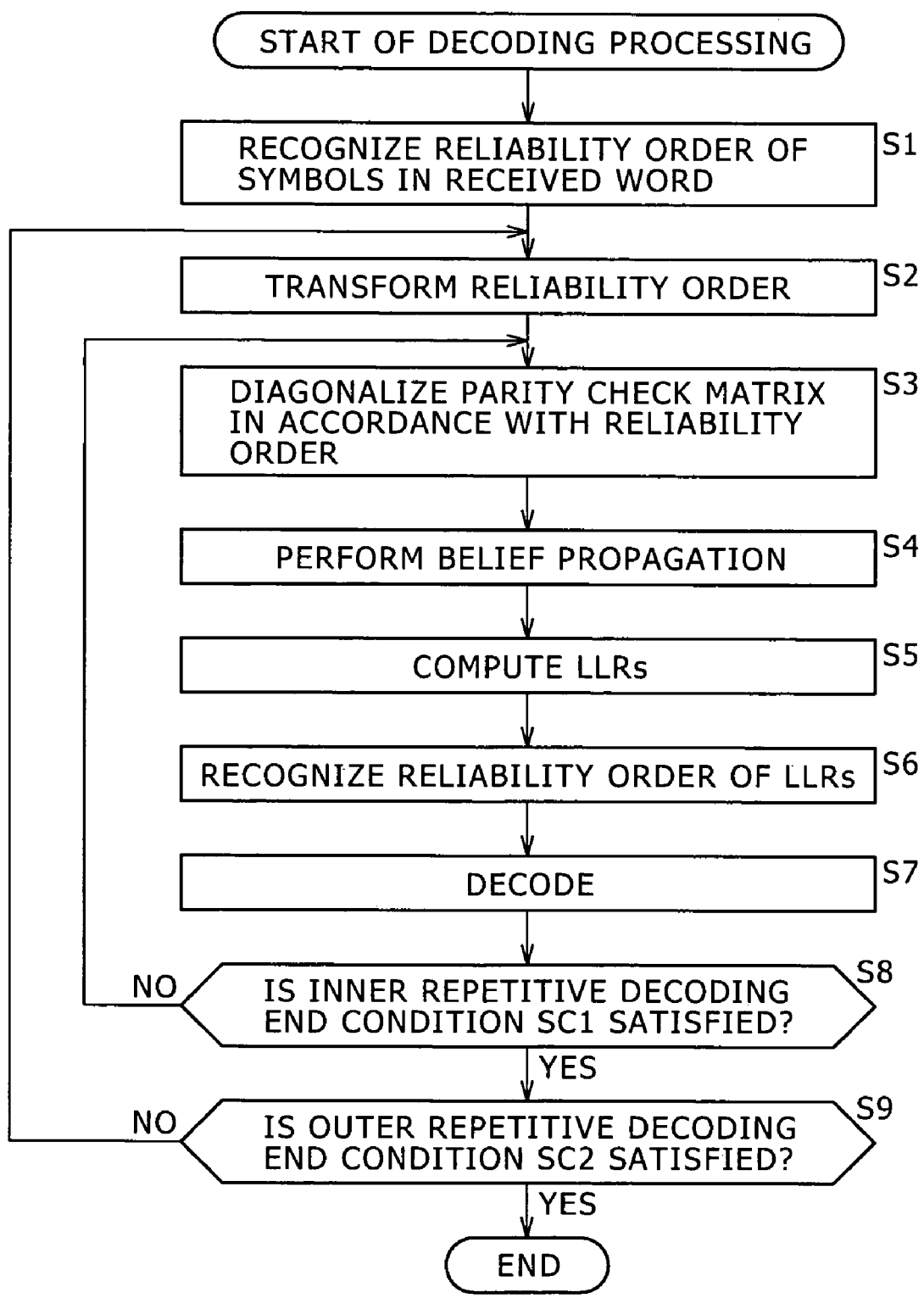
FIG. 1 shows a flowchart referred to in explaining the flow of the conventional decoding processing.

After the known information is attached to the received coded word, components employed in the known-information-involving ABP decoding apparatus 31 carry out the decoding processing represented by the flowchart shown in FIG. 1 on the coded word including the attached known information. That is to say, the components employed in the known-information-involving ABP decoding apparatus 31 carry out processes of steps S42 to S50 of the flowchart shown in FIG. 6 in the same way as respectively the processes of steps S1 to S9 of the flowchart shown in FIG. 1 on the coded word including the attached known information.

To put it in detail, after the known information is attached to the received coded word, at a step S42, the known-information addition section 52 recognizes the order of reliability levels assigned to the symbols of the received coded word and the attached known information, which have been stored in the received-word holding section 51. That is to say, the known-information addition section 52 recognizes the order of reliability levels assigned to LLRs stored in the received-word holding section 51.

Then, at the next step S43, the order transformation section 54 transforms the assignment of reliability levels to the symbols into new assignment. That is to say, the order transformation section 54 transforms the assignment of diagonalization priority levels to columns included in a parity check matrix as columns each corresponding to one of the symbols. In other words, the order transformation section 54 transforms the diagonalization order into a new order. Subsequently, at the next step S44, the parity-check-matrix diagonalization section 55 carries out a diagonalization process on the parity-check matrix in an execution order according to the new order of reliability levels assigned to the symbols, that is, according to the new order of diagonalization priority levels.

Then, at the next step S45, in order to update a message, the belief-propagation section 56 carries out a belief propagation process by using a parity check matrix already subjected to a diagonalization process. Then, at the next step S46, the LLR computation section 57 computes an LLR (Log Likelihood Ratio) of every coded symbol or updates the LLR of each coded symbol on the basis of the updated message. Subsequently, at the next step S47, the LLR-reliability-order recognition section 58 recognizes the reliability-level order of the computed LLRs and updates information stored in the received-word holding section 51.

Then, at the next step S48, the decoding section 59 decodes the LLRs found by the LLR computation section 57 to obtain a decoded word. Subsequently, at the next step S49, the inner-repetitive-decoding-end determination section 60 produces a result of determination as to whether or not the inner-side repetitive decoding termination condition SC1 is satisfied in order to make a decision on whether or not to terminate the inner-side repetitive decoding processing. If the result of the determination indicates that the inner-side repetitive decoding termination condition SC1 is not satisfied, that is, if a decision not to terminate the inner-side repetitive decoding processing is made, the decoding control section 61 controls the inner-repetitive-decoding-end determination section 60 to direct the flow of the processing back to the step S44 in order to repeat the processes of this step and the subsequent steps. That is to say, the known-information-involving ABP decoding apparatus 31 repeats the processes of the steps S44 to S49 in order to execute the inner-side repetitive decoding processing.

If the determination result produced in the process carried out at the step S49 indicates that the inner-side repetitive decoding termination condition SC1 is satisfied, that is, if a decision to terminate the inner-side repetitive decoding processing is made, on the other hand, the decoding control section 61 controls the inner-repetitive-decoding-end determination section 60 to terminate the inner-side repetitive decoding processing and reset the embedded inner counter. Then, the flow of the processing goes on to a step S50.

At the step S50, the outer-repetitive-decoding-end determination section 62 produces a result of determination as to whether or not the outer-side repetitive decoding termination condition SC2 is satisfied in order to make a decision on whether or not to terminate the outer-side repetitive decoding processing. If the result of the determination indicates that the outer-side repetitive decoding termination condition SC2 is not satisfied, that is, if a decision not to terminate the outer-side repetitive decoding processing is made, the decoding control section 61 controls the outer-repetitive-decoding-end determination section 62 to direct the flow of the processing back to the step S43 in order to repeat the processes of this step and the subsequent steps. That is to say, the known-information-involving ABP decoding apparatus 31 repeats the processes of the steps S43 to S50 in order to execute the outer-side repetitive decoding processing.

If the determination result produced in the process carried out at the step S50 indicates that the outer-side repetitive decoding termination condition SC2 is satisfied, that is, if a decision to terminate the outer-side repetitive decoding processing is made, on the other hand, the decoding control section 61 controls the outer-repetitive-decoding-end determination section 62 to terminate the outer-side repetitive decoding processing. Then, the execution of the decoding processing is ended after completing processes such as an operation to reset the embedded outer counter and an operation to output a decoded word generated by the decoding section 59 to a recipient external to the known-information-involving ABP decoding apparatus 31. The known-information-involving ABP decoding apparatus 31 carries out the decoding processing described above on every received coded word.

The above decoding processing is explained by describing a concrete example as follows. Let us assume for example that the decoding processing is carried out on RS(204, 188), which is a Reed-Solomon code. The RS Reed-Solomon code RS(204, 188) is a linear code c having a code length of 204 and an information length of 188 in a finite body $F_2^8$.

In this case, a code generation polynomial is expressed by Eq. (13) as follows:

$$g(x)=\Pi_{i=0}^{15}(x-\alpha^{i+b}) \qquad (13)$$

In addition, an information word is expressed by Eq. (14) as follows:

$$f=(f_0,f_1,f_2,\ldots,f_{187}) \qquad (14)$$

Furthermore, an information polynomial is expressed by Eq. (15) as follows:

$$f(x)=f_0+f_1x+f_2x^2+\ldots+f_{187}x^{187} \qquad (15)$$

At that time, a word coded by an organizational decoding process is expressed by Eq. (16) as follows:

$$c=(c_0,c_1,c_2,\ldots,c_{203}) \qquad (16)$$

A coded polynomial corresponding the coded word is expressed by Eq. (17) as follows:

$$\begin{aligned}c(x) &= c_0 + c_1 x + c_2 x^2 + \ldots + c_{203} x^{203} \\ &= q(x)f(x)\mathrm{mod}(x^{255}-1) \\ &= f(x)x^{16} + p(x)\mathrm{mod}(x^{255}-1)\end{aligned} \qquad (17)$$

It is to be noted that, in Eq. (17), the function q (x) is a quotient obtained as a result of an operation to divide the f (x)$x^{16}$ by the function g(x) whereas the function p(x) is the remainder of the division operation.

The Reed-Solomon code RS(204, 188) can be regarded as a Reed-Solomon code of an information word and a Reed-Solomon code of a coded word obtained by setting each of 51 symbols of the primitive Reed-Solomon code RS(255, 239) at zero. That is to say, the information word can be expressed by Eq. (18) as follows:

$$\begin{aligned}f_p &= (f_0, f_1, \ldots, f_{187}, f_{188}, f_{189}, \ldots, f_{238}) \\ &= (f_0, f_1, \ldots, f_{187}, 0, 0, \ldots, 0)\end{aligned} \qquad (18)$$

In the above information word, 51 latter symbols starting with $f_{188}$ serving as the 189th symbol and ending with $f_{238}$ serving with the 239th one are each set at zero. The coded word can be expressed by Eq. (19) as follows:

$$\begin{aligned}c_p &= (c_0, c_1, \ldots, c_{15}, c_{16}, c_{17}, \ldots, c_{203}, c_{204}, c_{205}, \ldots, c_{254}) \\ &= (p_0, p_1, \ldots, p_{15}, f_0, f_1, \ldots, f_{187}, 0, 0, \ldots, 0)\end{aligned} \qquad (19)$$

In the above coded word, 51 latter symbols starting with $c_{204}$ serving as the 205th symbol and ending with $c_{254}$ serving as the 255th one are each set at zero. That is to say, by setting each of some symbols of the information word of RS(255, 239) at zero and coding the information word, an information word having 188 essential symbols as shown in Eq. (20) is coded into a coded word with a code length of 204. This coding process is equivalent to a shortened-word coding process.

$$f=(f_0,f_1,\ldots,f_{187}) \qquad (20)$$

That is to say, as a result, by carrying out the shortened-word coding process described above, the information word expressed by Eq. (20) is coded to produce a coded word having a code length of 204 as expressed by Eq. (21) as follows.

$$c=(c_0,c_1,c_2,\ldots,c_{203}) \qquad (21)$$

Thus, a coding apparatus for implementing the shortened-word coding process does not transmit the 51 symbols each set at zero. Instead, the coding apparatus transmits only the coded word expressed by Eq. (21) to a decoding apparatus through a transmission line. As is obvious from Eq. (21), the coded word includes 204 symbols completing the shortened-word coding process.

With the Galois field GF ($2^8$) taken as an 8-dimensional vector space of the Galois field (2), each bit of the coded word expressed by Eq. (21) as a coded word completing the shortened-word coding process can be expanded into 8 bits. That is to say, the coded word expressed by Eq. (21) can be expanded into an array γ of 1,632 bits expressed by Eq. (22) as follows.

$$\gamma=(\gamma_0,\gamma_1,\gamma_2,\ldots,\gamma_{1631}) \qquad (22)$$

If the coding apparatus carries out a BPSK (Binary Phase Shift Keying) modulation process on the bit array γ expressed by Eq. (22) and then transmits the result of the BPSK modulation process to a decoding apparatus such as the known-information-involving ABP decoding apparatus 31 through an AWGN (Adaptive White Gaussian Noise) channel with a variance σ, a coded word received by the decoding apparatus is expressed by Eq. (23) as follows:

$$y=(y_0,y_1,y_2,\ldots,y_{1631}) \qquad (23)$$

A log likelihood ratio (LLR) Λ computed from the received coded word as the LLR of each symbol of the coded word is expressed by Eq. (24) as follows.

$$\Lambda = \log\frac{Pr(0\mid y)}{Pr(1\mid y)} = \frac{2y}{\sigma} \qquad (24)$$

The known-information-involving ABP decoding apparatus 31 carries out an adaptive belief propagation process on not only the received word, but also the portion exempted from a coding process. The 51 symbols exempted from a coding process are expressed by Eq. (25) as follows.

$$c=(c_{204},c_{205},\ldots,c_{254}) \qquad (25)$$

If each symbol of the portion exempted from a coding process is expanded into 8 bits in the same way as every symbol of the coded word described above, a bit array γ expressed by Eq. (26) is obtained as follows.

$$\gamma=(\gamma_{1632},\gamma_{1633},\ldots,\gamma_{2039}) \qquad (26)$$

Since the value of each uncoded symbol expanded into bits in Eq. (26) is zero, the value is said to be a known value. Thus, the known-information setting section 42 employed in the known-information-involving ABP decoding apparatus 31 sets the reliability level Λ of each of bits expressed by Eq. (26) as bits, which are obtained as a result of expansion of known symbols in the portion exempted from a coding process, at a value in a process carried out at the step S23 of the flowchart shown in FIG. 5. The process of setting the reliability level Λ of each of bits expressed by Eq. (26) at the value, which is a sufficiently large number M, is expressed by Eq. (27) as follows.

$$(\Lambda_{1632},\Lambda_{1633},\ldots,\Lambda_{2309})=(M,M,\ldots,M) \qquad (27)$$

In a process carried out at the step S41 of the flowchart shown in FIG. 6, the known-information addition section 52 employed in the known-information-involving ABP decoding apparatus 31 attaches known information to the 1,632 bits obtained as a result of expansion of the symbols in the coded word to produce reliability levels of a total of 2,040 bits. The attached known information is the reliability levels of the 408 bits expressed by Eq. (27) as bits obtained as a result of expansion of known symbols in the portion exempted from a coding process. Sections employed in the known-information-involving ABP decoding apparatus 31 then carry out the adaptive belief propagation decoding processing on the reliabilities for the linear code composed of the 2,040 bits by performing processes at the step S42 of the flowchart shown in FIG. 6 and the subsequent steps.

Figure 7:
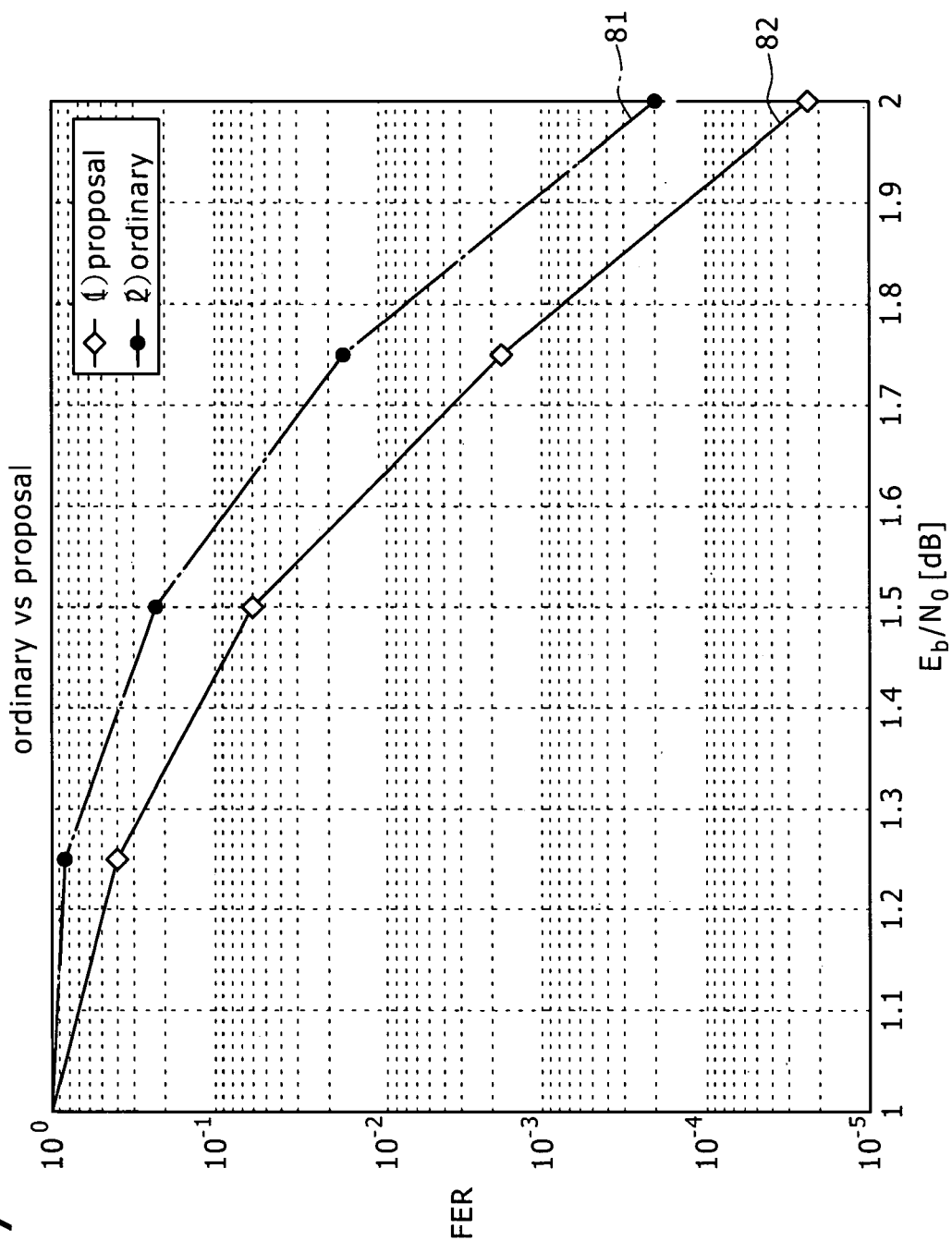
FIG. 7 shows graphs used for comparing a frame error rate of the conventional decoding processing with a frame error rate of the decoding processing according to the embodiment of the present invention.

FIG. 7 shows graphs for comparing the decoding performance of the conventional ABP (Adaptive Belief Propagation) decoding method with the decoding performance of the decoding method according to the present invention as described above in application of the methods to processes of decoding a shortened Reed-Solomon code RS(204, 188) described above. In this case, the conventional ABP (Adaptive Belief Propagation) decoding method is a decoding method implemented by combination of the ABP technique and the K-V list decoding technique. On the other hand, the decoding method according to the present invention is a decoding method implemented by combining the ABP technique and the K-V list decoding technique after adding the known information of a portion exempted from a coding process to a received coded word.

In FIG. 7, a graph represented by a curve 81 shows the decoding performance of the conventional ABP decoding method. On the other hand, a graph represented by a curve 82 shows the decoding performance of the decoding method according to the present invention. As is obvious from FIG. 7, the curve 82 showing the decoding performance of the decoding method according to the present invention has a small FER (Frame Error Rate) represented by the vertical axis in comparison with the curve 81 showing the decoding performance of the conventional decoding method, enhancing the error correction power. It is to be noted that, the larger the size of the portion exempted from a coding process, that is, the larger the number of bits included in the portion exempted from a coding process, the greater the improvement of the decoding performance.

As described above, the known-information-involving ABP decoding apparatus 31 assigns a sufficiently high level of reliability to each known symbol exempted from a coding process and attaches such levels of reliability to the reliability levels of symbols in the received coded word as known information. Then, the known-information-involving ABP decoding apparatus 31 carries out a decoding process on the entire coded word including the attached known information by adopting the ABP technique in order to reduce the error generation rate. As a result, the known-information-involving ABP decoding apparatus 31 is capable of exhibiting high decoding performance.

It is to be noted that the LLRs set for the known symbols of the uncoded portion attached to the received coded word do not need to have the same value. For example, the LLRs set for the known symbols may have different values representing different levels of reliability. As an alternative, only some known symbols have reliability levels different from each other while the remaining known symbols have the same value.

In addition, before a portion exempted from a coding process is omitted from a word to be transmitted, symbols included in the uncoded portion to be omitted from the word may be located at inconsecutive positions. That is to say, any symbols can be exempted from the coding and transmission processes. The positions of symbols to be exempted from the coding and transmission processes may vary from coding process to coding process. That is to say, every time a coding process is carried out, the position of a portion to be exempted from the coding process is arbitrarily selected. However, the decoding apparatus needs to know the position of the portion exempted from the coding process. For example, before receiving a coded word, the known-information-involving ABP decoding apparatus 31 acquires information supplied from the input section 41 as information on the position of a portion exempted from a coding process. Then, on the basis of this information, the known-information addition section 52 determines a position in the received coded word as a position at which known symbols are to be added to the coded word. Thus, even if a portion exempted from a coding process is omitted from an arbitrarily selected position in the pre-coding word, the known-information addition section 52 is capable of attaching known symbols at correct positions in the received coded word. By the correct positions, the original positions of the known symbols are implied.

In addition, the known-information-involving ABP decoding apparatus 31 carries out repetitive decoding processing by adopting the adaptive belied propagation technique and, in this decoding processing, the reliability level of each known symbol can be again set at a sufficiently large value every time the LLR of every coded symbol is updated. That is to say, the reliability level of each known symbol may be prevented from deteriorating due to a process to update the LLR of every coded symbol in the repetitive decoding processing.

In addition, when the decoding section 59 carries out a decoding process by using new LLRs computed by the LLR computation section 57 in the repetitive decoding processing, the decoding section 59 may utilize not only the LLRs of symbols included in the coded word, but also LLRs of known symbols. Matching between the decoded word obtained as a result of the decoding process and the known information can be examined to determine the validity of the result of the decoding process on the basis of the result of the examination. If zero has been set in the portion exempted from the coding process as the value of a known symbol but a value included in the result of the decoding process as the value of the known symbol is not zero, for example, the result of the decoding process is excluded from candidates for a correct decoded word.

In addition, even if the coding method adopted on the sender side is, for example, a code-position coding technique, by adoption of the decoding method described above, the known-information-involving ABP decoding apparatus 31 is capable of decoding a coded word obtained as a result of a coding process adopting the coding method. The code-position coding method does not have to be a code-position coding method for the Reed-Solomon codes. By adoption of the decoding method described above, the known-information-involving ABP decoding apparatus 31 is capable of decoding a coded word obtained as a result of a coding process adopting the code-position coding method for any code as long as the code-position coding method is such a code-position coding technique that the Reed-Solomon codes obtained as a result of the coding process adopting the code-position coding method is mapped onto an n×n diagonally regular matrix.

Figure 8:
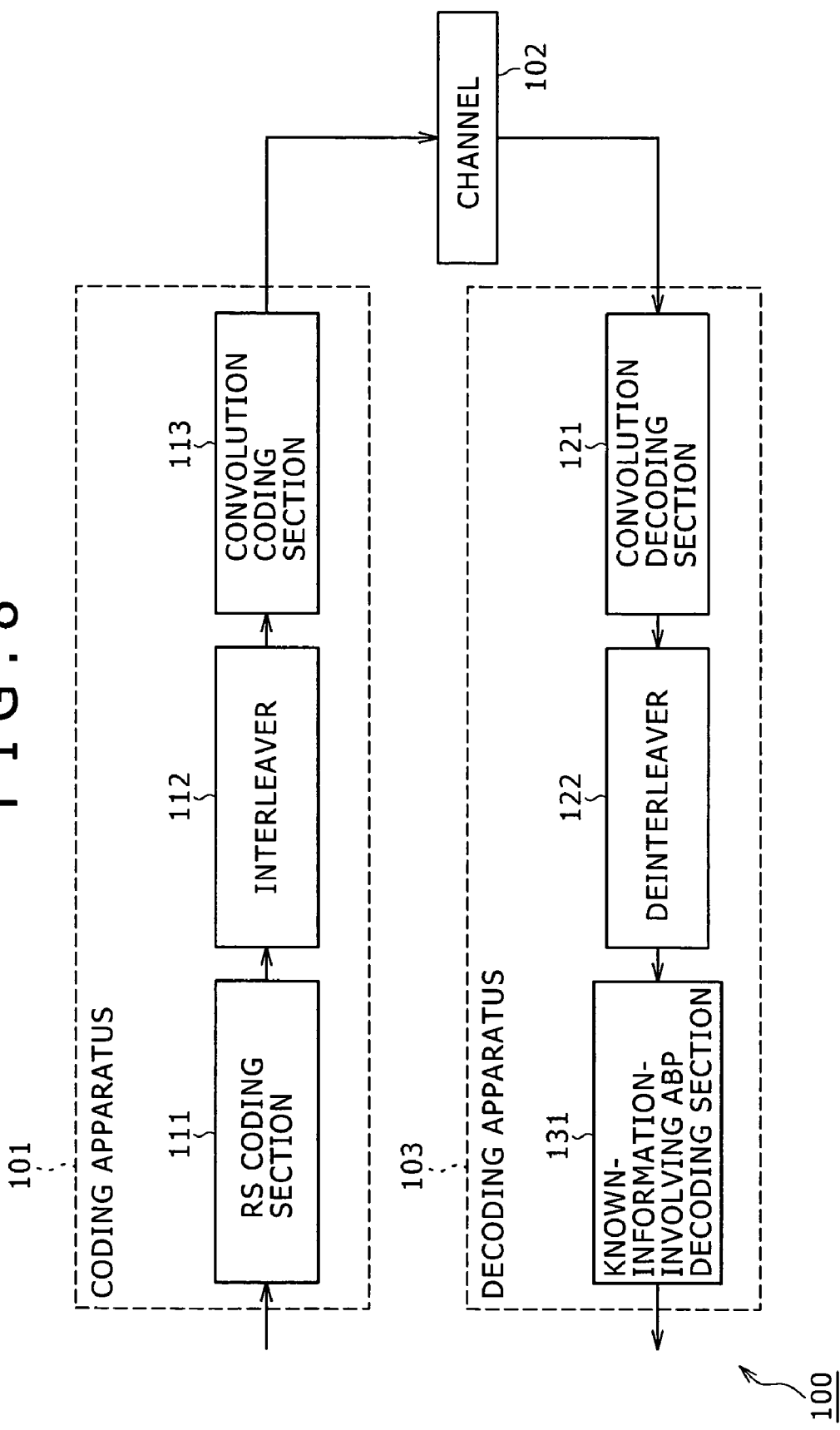
FIG. 8 is an explanatory block diagram showing a typical configuration of an error correction system according to the embodiment of the present invention.

The following description explains a concrete example of a method to apply the ABP decoding process of a coded word including known information as described above to an error correction system. FIG. 8 is an explanatory block diagram showing a typical configuration of an error correction system 100 in which a process provided by the present invention as the ABP decoding process of a coded word including known information is carried out. The error correction system 100 with the typical configuration shown in FIG. 8 is a digital-signal sender/receiver system used in typically television broadcasting. As shown in the figure, the error correction system 100 includes a coding apparatus 101, a channel 102 and a decoding apparatus 103.

The coding apparatus 101 functions as a transmission apparatus installed in broadcasting station or the like as an apparatus for transmitting a digital television signal from the broadcasting station or the like. The coding apparatus 101 has a Reed-Solomon coding section (RS coding section) 111, an interleaver 112 and a convolution coding section 113. The coding apparatus 101 is a unit for carrying out a shortened-word coding process on an information word and supplying a coded word obtained as a result of the shortened-word coding process to the decoding apparatus 103 through the channel 102.

The RS coding section 111 is a unit for carrying out a shortened-word coding process on an input information word by using Reed-Solomon codes and outputting a coded word including a predetermined number of symbols as a result of the shortened-word coding process. The interleaver 112 is a unit for rearranging symbols included in a coded word and outputting the coded word including the rearranged symbols as a result of the rearrangement process carried out by the RS coding section 111. The convolution coding section 113 is a unit for carrying out a convolution encoding process on a coded word received from the interleaver 112 and outputting a result of the convolution encoding process to the decoding apparatus 103 through the channel 102.

As described above, digital information received by the coding apparatus 101 from an external source as information to be transmitted by the coding apparatus 101 is subjected to a Reed-Solomon process carried out by the RS coding section 111 employed in the coding apparatus 101 before being supplied to the interleaver 112. The interleaver 112 carries out an interleaving process of rearranging symbols included in the information in order to disperse burst errors generated along the channel 102, which serves as the principal communication path. Since the Reed-Solomon codes are subjected to an error correction process, which handles a plurality of bits as a symbol, the interleaver 112 carries out a symbol interleaving process for dispersing burst errors in symbol units.

The rearranged digital information to be transmitted is then supplied to the convolution coding section 113 to be further subjected to a convolution coding process for determining an array of codes sequentially on the basis of a plurality of information blocks. When the convolution coding section 113 receives digital information from the interleaver 112 in information block units each having a length of k bits, for example, the convolution coding section 113 having a constraint length K encodes an information block into a coded block having n bits on the basis of not only the information block currently being received, but also K information blocks including information blocks received in the past.

Then, the digital information completing the convolution encoding process is converted into data having a transmissible format in a transmission section not shown in the figure before being output to the channel 102 as a transmitted word. That is to say, the coding apparatus 101 codes the received television signal and transmits (or broadcasts) the coded television signal. The transmitted coded word is supplied to the decoding apparatus 103 through the channel 102. In this case, the channel 102 is a wire or radio transmission line through which a television signal is transmitted.

The decoding apparatus 103 functions as a reception apparatus such as a digital television signal receiver to receive a television signal transmitted or broadcasted by the coding apparatus 101 from typically a broadcasting station. As shown in the figure, the decoding apparatus 103 has a convolution decoding section 121, a deinterleaver 122 and a known-information-involving ABP decoding section 131.

The convolution decoding section 121 is a unit for carrying out a convolution-code soft-decision decoding process on an input word to generate a decoded word. A typical convolution-code soft-decision decoding process is a decoding process adopting a BCJR (Bahl, Cocke, Jelinek and Raviv) algorithm or a SOVA (Soft Output Viterbi Algorithm). The deinterleaver 122 is a unit for restoring the rearranged information to its original order. The known-information-involving ABP decoding section 131 is a unit obtained as a result of adaptation of the known-information-involving ABP decoding apparatus 31 of FIG. 3 to the error correction system 100. Basically, the known-information-involving ABP decoding section 131 has a configuration similar to the configuration of the known-information-involving ABP decoding apparatus 31 and carries out processing similar to the processing performed by the known-information-involving ABP decoding apparatus 31. Thus, for information on the configuration of the known-information-involving ABP decoding section 131 and processing carried out by the known-information-involving ABP decoding section 131, the descriptions of the known-information-involving ABP decoding apparatus 31 can be referred to. Detailed explanation of the known-information-involving ABP decoding section 131 is therefore omitted. Briefly speaking, the known-information-involving ABP decoding section 131 adds known information to a coded word received from the deinterleaver 122 and carries out the ABP repetitive decoding processing on the coded word including the added known information to generate a decoded word. In this case, the coded word received from the deinterleaver 122 is a result of the convolution-code soft-decision decoding process carried out by the convolution decoding section 121 and the restoration process carried out by the deinterleaver 122.

As described above, the decoding apparatus 103 decodes a received television signal. To put it in detail, the decoding apparatus 103 receives the television signal transmitted by the transmission section not shown in the figure to the decoding apparatus 103 through the channel 102. The received word of the television signal is supplied to the convolution decoding section 121 for carrying out a convolution-code soft-decision decoding process on the word. The information of the word obtained as a result of the convolution-code soft-decision decoding process is supplied to the deinterleaver 122 for carrying out a de-interleaving process of rearranging the information by adoption of a method corresponding to the interleaving method adopted by the interleaver 112 employed in the coding apparatus 101. The de-interleaving process is carried out in order to restore the information rearranged by the interleaver 112 to its original order. By adoption of the methods described before, the known-information-involving ABP decoding section 131 attaches known information to the digital information restored to its original order and carries out ABP repetitive decoding processing on the digital information including the added known information to generate a decoded word. To be more specific, after updating levels of reliability by adopting the ABP technique, a post-hard-decision limit distance decoding process, a list decoding process or a soft-decision list decoding process taking soft values as an input without modifications is carried out to generate a decoded word. Then, the known-information-involving ABP decoding section 131 outputs the decoded word to a recipient apparatus outside the decoding apparatus 103. The decoded word is a result of reproduction of the digital information coded by the coding apparatus 101.

As described above, in the error correction system 100 with the configuration shown in FIG. 8, the decoding apparatus 103 adds known information to a received coded word before carrying out ABP repetitive decoding processing on the received coded word including the added known information. Thus, decoding processing can be carried out with a high degree of performance. As a result, communications can be performed with a high degree of precision.

In the error correction system 100, the coding process explained above is carried out by using a Reed-Solomon code. It is to be noted, however, that the code used in the coding process is not limited to the Reed-Solomon code. For example, the code used in the coding process can be a BCH code or another coding method can also be applied.

Figure 9:
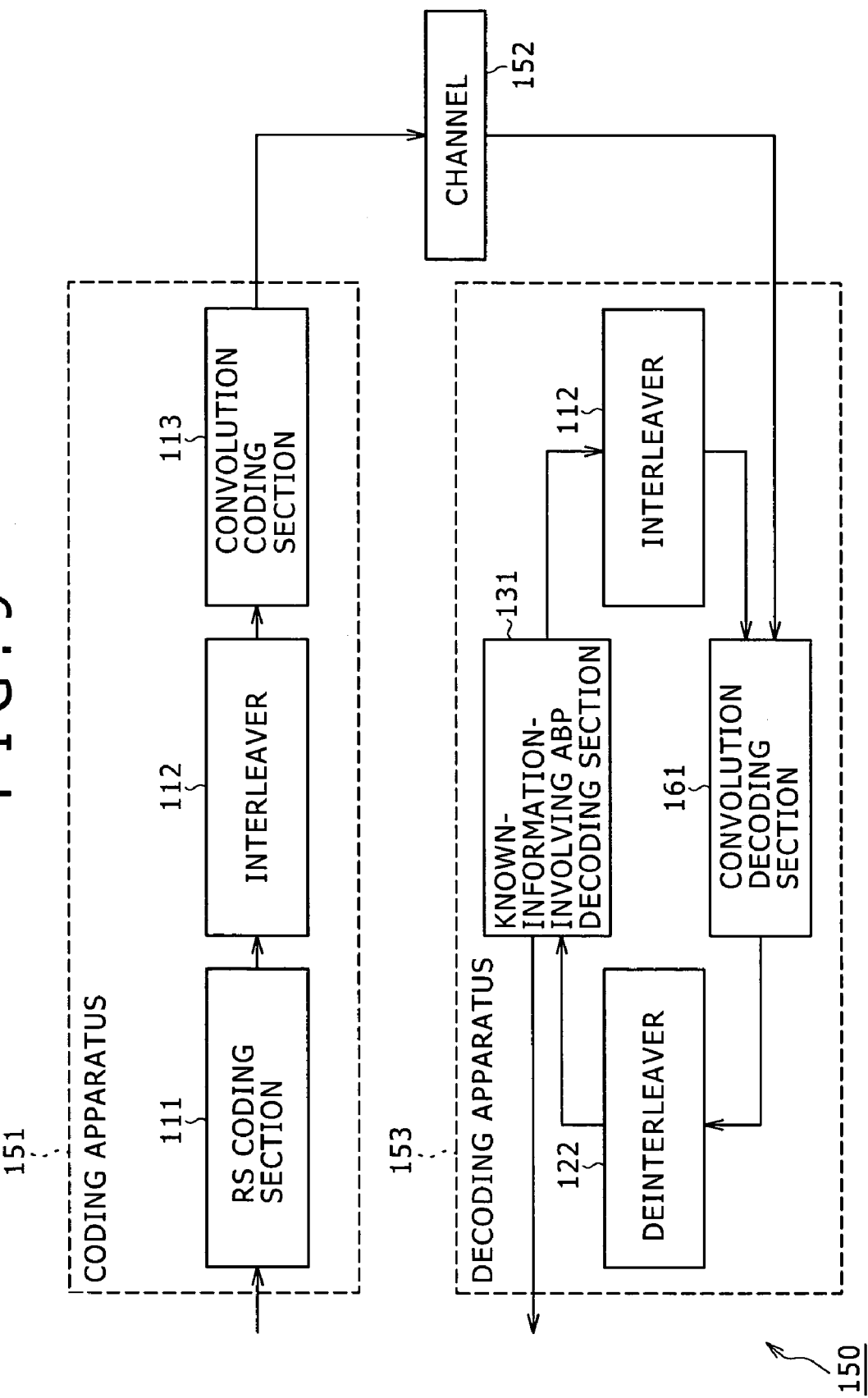
FIG. 9 is an explanatory block diagram showing another typical configuration of an error correction system according to the embodiment of the present invention.

FIG. 9 is an explanatory block diagram showing another typical configuration of an error correction system 150 to which a process provided by the present invention as the ABP decoding process of a coded word including known information is applied. The error correction system 150 with the configuration shown in FIG. 9 includes a coding apparatus 151, a channel 152 and a decoding apparatus 153. The error correction system 150 is typically a digital communication system used for digital televisions.

The coding apparatus 151 is an apparatus similar to the coding apparatus 101 employed in the configuration shown in FIG. 8. To be more specific, the coding apparatus 151 has a configuration similar to that of the coding apparatus 101 and carries out processing similar to that performed by the coding apparatus 101. That is to say, the coding apparatus 151 has a Reed-Solomon coding section (RS coding section) 111, an interleaver 112 and a convolution coding section 113. Thus, the explanation of the coding apparatus 101 holds true of the coding apparatus 151, making it unnecessary to repeat the explanation.

By the same token, the channel 152 is identical with the channel 102 employed in the configuration shown in FIG. 8. That is to say, the channel 152 is a wire or radio transmission line through which a television signal is transmitted.

The decoding apparatus 153 has a convolution decoding section 161, a deinterleaver 122, a known-information-involving ABP decoding section 131 and an interleaver 112. The convolution decoding section 161 receives a coded word transmitted by the transmission section not shown in the figure to the decoding apparatus 153 through the channel 152. The transmission section is a section employed in the coding apparatus 151. Then, the convolution decoding section 161 carries out a soft-decision decoding process adopting an algorithm such as the BCJR algorithm or the SOVA on the received coded word, and supplies the result of the soft-decision decoding process to the deinterleaver 122. In addition, the convolution decoding section 161 also receives a coded word from the interleaver 112. The coded word is a result of a process carried out by the interleaver 112 to rearrange a decoded word output by the known-information-involving ABP decoding section 131 as a result of ABP repetitive decoding processing carried out by the known-information-involving ABP decoding section 131 on a coded word including known information. The convolution decoding section 161 carries out the soft-decision decoding process adopting an algorithm such as the BCJR algorithm or the SOVA on the coded word received from the interleaver 112 in the same way as the coded word received from the aforementioned transmission section not shown in the figure, and also supplies the result of the soft-decision decoding process to the deinterleaver 122 as well.

The deinterleaver 122 is a unit operating in the same way as the deinterleaver 122 employed in the decoding apparatus 103 employed in the configuration shown in FIG. 8. That is to say, the deinterleaver 122 rearranges information received from the convolution decoding section 161 as a result of the soft-decision decoding process and supplies the rearranged information to the known-information-involving ABP decoding section 131.

By the same token, the known-information-involving ABP decoding section 131 is a unit operating in the same way as the known-information-involving ABP decoding section 131 employed in the decoding apparatus 103 with the configuration shown in FIG. 8. That is to say, the known-information-involving ABP decoding section 131 attaches known information to information received from the deinterleaver 122 as a result of rearranging the result of the soft-decision decoding process carried out by the convolution decoding section 161, and carries out ABP repetitive decoding processing on the received information including the added known information in order to generate a decoded word. Then, the known-information-involving ABP decoding section 131 outputs the decoded word to the interleaver 112.

Likewise, the interleaver 112 is a unit operating in the same way as the interleaver 112 employed in the coding apparatus 151. To put it concretely, the interleaver 112 rearranges information received from the known-information-involving ABP decoding section 131 as a decoded word obtained as a result of the ABP repetitive decoding processing to a predetermined order. The rearrangement pattern adopted by the interleaver 112 is the same as that adopted by the interleaver 112 employed in the coding apparatus 151. The interleaver 112 then supplies digital information obtained as a result of the rearrangement process back to the convolution decoding section 161.

As described above, the decoding apparatus 153 repeatedly carries out a soft-decision decoding process in the convolution decoding section 161 and a known-information-involving repetitive decoding process in the known-information-involving ABP decoding section 131 on a coded word received from the transmission section not shown in the figure while passing the processed information through the deinterleaver 122 and the interleaver 112 in order to lower a decoding error probability in the decoding processes. It is to be noted that the number of times the decoding processes are to be carried out in the whole decoding apparatus 153 can be determined in advance. As an alternative, the decoding apparatus 153 may determine whether or not the repeated executions of the decoding processes are to be ended on the basis of a condition such as the number of positions to be subjected to an error correction process.

As described above, in the error correction system 150 having the configuration shown in FIG. 9, the decoding apparatus 153 is capable of carrying out decoding processing with a high degree of performance. As a result, communications can be performed with a high degree of precision.

In the error correction system 150, the coding process explained above is carried out by using a Reed-Solomon code. It is to be noted, however, that the code used in the coding process is not limited to the Reed-Solomon code. For example, the code used in the coding process can be a BCH code or another coding method can also be applied.

FIG. 10 is an explanatory block diagram showing a further typical configuration of an error correction system 200 to which a process provided by the present invention as the ABP decoding process of a coded word including known information is applied. As shown in FIG. 10, the error correction system 200 includes a coding apparatus 201, a channel 202 and a decoding apparatus 203. The error correction system 200 is typically a system provided for a recording/reproduction apparatus for recording and reproducing information onto and from a digital recording medium. An example of such a recording/reproduction apparatus is a DVD (Digital Versatile Disc) record player.

That is to say, the error correction system 200 serving as a recording/reproduction apparatus includes the coding apparatus 201 to serve as a coding section, the channel 202 to serve as the recording medium employed in a recording/reproduction section not shown in the figure and the decoding apparatus 203 to serve as a decoding section. To put it in detail, the coding apparatus 201 employed in the error correction system 200 is a coding section for carrying out a shortened-word coding process on digital information received from an external source and driving the recording/reproduction section to record the result of the shortened-word coding process onto the channel 202. On the other hand, the decoding apparatus 203 employed in the error correction system 200 is a decoding section for driving the recording/reproduction section to reproduce digital information from the channel 202, decoding the reproduced digital information to generate original digital information and outputting the decoded digital information to a recipient apparatus external to the error correction system 200.

The coding apparatus 201 includes Reed-Solomon coding sections (RS coding sections) 211-1 to 211-n where notation n denotes a natural number. The Reed-Solomon coding sections 211-1 to 211-n are each a section for carrying out a shortened-word Reed-Solomon coding process on digital information with respect to dimensions different from each other.

For example, the RS coding section 211-1 is a section for carrying out a shortened-word Reed-Solomon coding process on a predetermined number of symbols with respect to the first dimension, the RS coding section 211-2 is a section for carrying out a shortened-word Reed-Solomon coding process on a predetermined number of symbols with respect to the second dimension after the coding process carried out by the RS coding section 211-1, and so on. Finally, the RS coding section 211-n is a section for carrying out a shortened-word Reed-Solomon coding process on a predetermined number of symbols with respect to the nth dimension after the coding process carried out by the RS coding section 211-(n−1). In this way, the Reed-Solomon coding sections 211-1 to 211-n sequentially carry out shortened-word Reed-Solomon coding processes on predetermined numbers of symbols with respect to their respective dimensions. As the shortened-word Reed-Solomon coding process carried out by the RS coding section 211-n is ended, the coding apparatus 201 supplies digital information obtained as a result of the shortened-word Reed-Solomon coding process to the recording/reproduction section not shown in the figure.

The recording/reproduction section is a section for carrying out processes on information received from the coding apparatus 201 before recording the information onto the channel 202 serving as a recording medium. The processes include an NRZI (Non Return to Zero Invert) conversion process, which is also referred to as an NRZI encoding process. In addition, the recording/reproduction section is also a section for reproducing digital information recorded on the channel 202 serving as a recording medium. To be more specific, the recording/reproduction section is also a section for reproducing digital information completing a Reed-Solomon coding process from the channel 202, decoding the reproduced digital information and supplying the decoded digital information to the decoding apparatus 203. In this case, the recording/reproduction section decodes the reproduced digital information by restoring the post-NRZI-conversion state of the digital information to its original state.

The decoding apparatus 203 is a decoder provided for the coding apparatus 201. The decoding apparatus 203 includes n known-information-involving ABP decoding sections 231-1 to 231-n each used for carrying out known-information-involving repetitive ABP decoding processing on digital information with respect to its unique dimension.

The known-information-involving ABP decoding sections 231-1 to 231-n correspond to respectively the Reed-Solomon coding sections 211-1 to 211-n employed in the coding apparatus 201. Each of the known-information-involving ABP decoding sections 231-1 to 231-n attaches known information to a word completing a shortened-word Reed-Solomon coding process with respect to its unique dimension and carries-out repetitive decoding processing adopting the ABP technique on the word including the attached known information. The known-information-involving ABP decoding sections 231-1 to 231-n each have basically the same configuration and carry out basically the same operations as the known-information-involving ABP decoding apparatus 31 employed in the configuration shown in FIG. 3. Thus, the flowcharts shown in FIGS. 5 and 6 as well as the block diagram of FIG. 3 can be regarded as the flowcharts as well as block diagram for each of the known-information-involving ABP decoding sections 231-1 to 231-n employed in the decoding apparatus 203 as the flowcharts shown in FIGS. 5 and 6 as well as the block diagram of FIG. 3 are regarded as the flowcharts as well as block diagram for the known-information-involving ABP decoding section 131 shown in FIGS. 8 and 9.

That is to say, each of the known-information-involving ABP decoding sections 231-1 to 231-n employed in the decoding apparatus 203 carries out operations including the process to attach known information to a word completing a shortened-word Reed-Solomon coding process with respect to its unique dimension and the repetitive decoding processing adopting the ABP technique on the word including the attached known information as described above. As is obvious from FIG. 10, with respect to the dimensions, these operations are carried out sequentially by the known-information-involving ABP decoding sections 231-1 to 231-n connected in series in the decoding apparatus 203 in an order opposite to the order of the operations carried out by the Reed-Solomon coding sections 211-1 to 211-n employed in the coding apparatus 201. To be more specific, with regard to the repetitive decoding processing adopting the ABP technique on the word including the attached known information, the known-information-involving ABP decoding section 231-n carries out the decoding processing with respect to the highest nth dimension, the known-information-involving ABP decoding section 231-(n−1) following the known-information-involving ABP decoding section 231-n then carries out the decoding processing with respect to the next lower (n−1)th dimension, the known-information-involving ABP decoding section 231-(n−2) following the known-information-involving ABP decoding section 231-(n−1) subsequently carries out the decoding processing with respect to the next lower (n−2)th dimension, and so on. Finally, the known-information-involving ABP decoding section 231-1 following the known-information-involving ABP decoding section 231-2 carries out the decoding processing with respect to the lowest 1st dimension. The decoding apparatus 203 outputs the restored original digital information obtained as the result of the decoding processing carried out by the known-information-involving ABP decoding sections 231-1 to a recipient apparatus external to the error correction system 200.

In the operations described above, the decoding apparatus 203 employed in the error correction system 200 is capable of easily carrying out decoding processing with a high degree of performance. That is to say, the error correction system 200 functioning as a recording/reproduction apparatus is capable of carrying out an operation of recording digital information onto a recording medium thereof and an operation to reproduce digital information from the recording medium with a higher degree of accuracy.

In the error correction system 200 described above, the Reed-Solomon code is used in coding and decoding processes. It is to be noted, however, that the code used in coding and decoding processes is not limited to the Reed-Solomon code. For example, the code used in the coding and decoding process can be a BCH code or another coding/decoding method can also be applied.

FIG. 11 is an explanatory block diagram showing a still further typical configuration of an error correction system 250 to which a process provided by the present invention as the ABP decoding process of a coded word including known information is applied. As shown in FIG. 11, the error correction system 250 includes a coding apparatus 251, a channel 252 and a decoding apparatus 253. The error correction system 250 is typically a system provided for a recording/reproduction apparatus for recording and reproducing information onto and from a digital recording medium. An example of such a recording/reproduction apparatus is a DVD (Digital Versatile Disc) record player.

That is to say, much like the configuration shown in FIG. 10, the coding apparatus 251 employed as a coding section in the error correction system 250 used in a recording/reproduction apparatus carries out a shortened-word coding process on a predetermined number of symbols and then records the result of the shortened-word coding process onto the channel 252 employed as a recording medium in a recording/reproduction section not shown in the figure. In addition, the decoding apparatus 253 employed as a decoding section in the error correction system 250 functioning as a recording/reproduction apparatus carries out a decoding process on digital information stored on the channel 252 employed as a recording medium in the recording/reproduction section in order to acquire the original digital information and outputs the original digital information to a recipient apparatus external to the error correction system 250.

The coding apparatus 251 is an apparatus identical with the coding apparatus 201 employed in the configuration shown in FIG. 10. To be more specific, the coding apparatus 251 has the same configuration and carries out the same operations as the coding apparatus 201. That is to say, for example, the RS coding section 211-1 carries out a shortened-word Reed-Solomon coding process on a predetermined number of symbols with respect to the first dimension, the RS coding section 211-2 carries out a shortened-word Reed-Solomon coding process on a predetermined number of symbols with respect to the second dimension after the coding process carried out by the RS coding section 211-1, and so on. Finally, the RS coding section 211-n carries out a shortened-word Reed-Solomon coding process on a predetermined number of symbols with respect to the nth dimension after the coding process carried out by the RS coding section 211-(n−1). In this way, the Reed-Solomon coding sections 211-1 to 211-n sequentially carry out shortened-word Reed-Solomon coding processes on predetermined numbers of symbols with respect to their respective dimensions. As the shortened-word Reed-Solomon coding process carried out by the RS coding section 211-n is ended, the coding apparatus 251 supplies digital information obtained as a result of the shortened-word Reed-Solomon coding process to the recording/reproduction section not shown in the figure.

The recording/reproduction section is a section for carrying out processes on information received from the coding apparatus 251 before recording the information onto the channel 252 serving as a recording medium. The processes include an NRZI (Non Return to Zero Invert) conversion process, which is also referred to as an NZRI encoding process. In addition, the recording/reproduction section is also a section for reproducing digital information recorded on the channel 252 serving as a recording medium. To be more specific, the recording/reproduction section is also a section for reproducing digital information completing a Reed-Solomon coding process from the channel 252, decoding the reproduced digital information and supplying the decoded digital information to the decoding apparatus 253. In this case, the recording/reproduction section decodes the reproduced digital information by restoring the post-NZRI-conversion state of the digital information to its original state.

The decoding apparatus 253 is a decoder provided for the coding apparatus 251. The decoding apparatus 203 includes m decoding sections 261-1 to 261-m connected each other in series. Each of the decoding sections 261-1 to 261-m has the same configuration and carries out the same operations as the known-information-involving ABP decoding sections 231-1 to 231-n employed in the configuration shown in FIG. 10.

Much like the decoding apparatus 203 employed in the configuration shown in FIG. 10, n known-information-involving ABP decoding sections 231-1 to 231-n connected in series in each of the m decoding sections 261-1 to 261-m correspond to respectively the Reed-Solomon coding sections 211-1 to 211-n employed in the coding apparatus 251. As described earlier, each of the known-information-involving ABP decoding sections 231-1 to 231-n attaches known information to a word completing a shortened-word Reed-Solomon coding process with respect to its unique dimension and carries out repetitive decoding processing adopting the ABP technique on the word including the attached known information.

First of all, each of the known-information-involving ABP decoding sections 231-1 to 231-n employed in the decoding section 261-1 of the decoding apparatus 253 carries out operations including the process to attach known information to a word completing a shortened-word Reed-Solomon coding process with respect to its unique dimension and the repetitive decoding processing using the ABP on the word including the attached known information as described above. The word completing a shortened-word Reed-Solomon coding process is digital information received from the recording/reproduction section not shown in the figure as information reproduced by the recording/reproduction section from the channel 252.

As is obvious from FIG. 11, with respect to the dimensions, these operations are carried out sequentially by the known-information-involving ABP decoding sections 231-1 to 231-n connected in series in the decoding section 261-1 in an order opposite to the order of the operations carried out by the Reed-Solomon coding sections 211-1 to 211-n employed in the coding apparatus 251. To be more specific, with regard to the repetitive decoding processing adopting the ABP technique on the word including the attached known information, the known-information-involving ABP decoding section 231-n carries out the decoding processing with respect to the highest nth dimension, the known-information-involving ABP decoding section 231-(n−1) following the known-information-involving ABP decoding section 231-n then carries out the decoding processing with respect to the next lower (n−1)th dimension, the known-information-involving ABP decoding section 231-(n−2) following the known-information-involving ABP decoding section 231-(n−1) subsequently carries out the decoding processing with respect to the next lower (n−2)th dimension, and so on. Finally, the known-information-involving ABP decoding section 231-1 following the known-information-involving ABP decoding section 231-2 carries out the decoding processing with respect to the lowest 1st dimension.

As the operations carried out by the decoding section 261-1 are completed, the decoding section 261-1 outputs the result of the decoding processing to the decoding section 261-2. In the same way as the decoding section 261-1, the known-information-involving ABP decoding sections 231-1 to 231-n employed in the decoding section 261-2 sequentially carry out the operations including the process to attach known information to a word completing a shortened-word Reed-Solomon coding process and the repetitive decoding processing adopting the ABP technique on the word including the attached known information with respect to their respective dimensions while gradually decreasing the dimension order. As the operations carried out by the decoding section 261-2 are completed, the decoding section 261-2 outputs the result of the decoding processing to the decoding section 261-3. In the same way as the decoding section 261-1, the decoding section 261-3 carries out the operations described above, outputting the result of the decoding processing to the decoding section 261-4 and so on. Finally, as the operations carried out by the decoding section 261-m are completed, the decoding apparatus 253 outputs the restored original digital information obtained as the result of the operations carried out by the decoding section 261-m to a recipient apparatus external to the error correction system 250.

In the operations described above, the decoding apparatus 253 employed in the error correction system 250 is capable of easily carrying out decoding processing with a high degree of performance. That is to say, the error correction system 250 functioning as a recording/reproduction apparatus is capable of carrying out an operation of recording digital information onto a recording medium thereof and an operation to reproduce digital information from the recording medium with a higher degree of accuracy.

In the error correction system 250 described above, the Reed-Solomon code is used in coding and decoding processes. It is to be noted, however, that the code used in coding and decoding processes is not limited to the Reed-Solomon code. For example, the code used in the coding and decoding process can be a BCH code or another coding/decoding method can also be applied.

The series of processes described previously can be carried out by hardware and/or execution of software. If the series of processes described above is carried out by execution of software, the decoding apparatus or error correction system explained above can typically be implemented by a personal computer 300 shown in FIG. 12.

In the personal computer 300 shown in FIG. 12, a CPU (Central Processing Unit) 301 carries out various kinds of processing by execution of programs stored in a ROM (Read Only Memory) 302 or programs loaded from a storage section 313 into a RAM (Random Access Memory) 303. The RAM 303 is also used for properly storing various kinds of information such as data required in the processing carried out by the CPU 301.

The CPU 301, the ROM 302 and the RAM 303 are connected to each other by a bus 304, which is also connected to an input/output interface 310.

The input/output interface 310 is connected to an input section 311, an output section 312, the storage section 313 cited above and a communication section 314. The input section 311 includes a keyboard and a mouse whereas the output section 312 includes a display unit and a speaker. The display unit can be a CRT (Cathode Ray Tube) display unit or an LCD (Liquid Crystal Display) unit. The storage section 313 includes a hard disk. The communication section 314 has a modem. The communication section 314 is a unit for carrying out communication processing with other apparatus through a network such as the Internet.

If necessary, the input/output interface 310 is also connected to a drive 315 on which a removable recording medium 321 is mounted. The removable recording medium 321 can be a magnetic disk, an optical disk, a magneto-optical disk or a semiconductor memory. As described above, a computer program loaded into the RAM 303 to be executed by the CPU 301 is originally installed from the removable recording medium 321 into the storage section 313 if necessary.

Programs composing the software to be executed to carry out the series of processes described previously can also be installed into the storage section 313 from a network in addition to the removable recording medium 321.

The removable recording medium 321 for recording programs to be installed into the personal computer 300 as programs to be executed by CPU 301 employed in the personal computer 300 is a recording medium provided to the user separately from the main unit of the personal computer 300 as shown in FIG. 12. Examples of the removable recording medium include a magnetic disk such as a flexible disk, an optical disk such as a CD-ROM (Compact Disk-Read Only Memory) or a DVD (Digital Versatile Disk), a magneto-optical disk such as an MD (Mini Disk, which is a trademark) as well as a semiconductor memory. Instead of installing the programs from the removable recording medium 321, the programs can also be stored in advance in an embedded recording medium included in the main unit of the personal computer 300. Examples of the embedded recording medium are a hard disk included in the storage section 313 and the ROM 302.

It is also worth noting that, in this specification, steps of the flowchart described above can be carried out not only in a pre-prescribed order along the time axis, but also concurrently or individually.

It is to be noted that the technical term 'system' used in this specification implies the configuration of a confluence including a plurality of apparatus. It is also worth noting that a configuration explained as a single apparatus in the descriptions given so far can also be divided into a plurality of apparatus. Conversely speaking, a plurality of apparatus explained in the descriptions given so far can also be combined into a single apparatus. In addition, it is needless to say that a configuration other than those described so far can be added to the configuration of each apparatus explained in the above descriptions. A portion of the configuration of an apparatus can be included in the configuration of another apparatus if the inclusion virtually does not change the operations and configuration of the whole system.

In addition, it should be understood by those skilled in the art that a variety of modifications, combinations, sub-combinations and alterations may occur in dependence on design requirements and other factors insofar as they are within the scope of the appended claims or the equivalents thereof.

What is claimed is:

1. A decoding apparatus for carrying out a decoding process on a ring-R linear code, the decoding apparatus comprising:

means for acquiring a coded word having a code length that is reduced by omission of one or more symbols from the coded word and for holding the coded word;

means for attaching, to the coded word, a reliability level corresponding to each of the omitted symbols, the reliability level including known information comprising known symbols, wherein each of the known symbols have a known value; and means for repeatedly carrying out a decoding process using belief propagation on the coded word and the attached known information.

2. The decoding apparatus according to claim 1 wherein an LLR (Log Likelihood Ratio) is used as the level of reliability.

3. The decoding apparatus according to claim 1, further comprising means for setting the known information to be attached by the means for attaching.

4. The decoding apparatus according to claim 3 wherein the means for setting assigns a high level of reliability to each of the known symbols.

5. The decoding apparatus according to claim 3, further comprising means for holding the known information set by the means for setting, wherein the means for attaching attaches the held known information to the coded word.

6. The decoding apparatus according to claim 1 wherein the means for repeatedly carrying out decoding comprises:

means for recognizing an order of reliability levels of symbols included in the coded word held with the attached known information;

means for carrying out a diagonalization process on a parity check matrix on the basis of information corresponding to a reliability-level order recognized by the means for recognizing;

means for updating a message by carrying out a belief propagation process through use of the parity check matrix that is subjected to the diagonalization process;

means for computing log likelihood ratios by using the updated message and the symbols of the coded word;

means for recognizing an order of reliability levels of the computed log likelihood ratios;

means for carrying out a decoding process by using the computed log likelihood ratios;

means for producing a first result of determination as to whether or not a first condition for termination of the repeatedly performed decoding processing is satisfied;

means for producing a second result of determination as to whether or not a second condition for termination of the repeatedly performed decoding processing is satisfied; and means for executing control controlling the means for recognizing an order of reliability levels of symbols included in the coded word, the means for carrying out the diagonalization, the means for updating, the means for computing, the means for recognizing an order of reliability of levels of the computed log likelihood ratios, and the means for carrying out the decoding process to repeatedly carry out their respective processes till a predetermined process termination condition is satisfied based on the first and second determination result.

7. The decoding apparatus according to claim 6 wherein the diagonalization process is carried out sequentially on columns of the parity check matrix on a priority basis in an execution order starting from a column corresponding to a symbol that is included in the received coded word and has a lowest level of reliability.

8. The decoding apparatus according to claim 6 wherein the means for carrying out the diagonalization process:

arranges columns of the parity check matrix into a column array starting with a column corresponding to a symbol that is included in the received coded word and has a lowest level of reliability;

rearranges one or more of the columns included in the column array in accordance with a predetermined method; and carries out a diagonalization process on the columns of the parity check matrix in an execution order according to a result of the rearrangement.

9. The decoding apparatus according to claim 6 wherein the means for carrying out the diagnalization process:

prepares a plurality of methods to be used as a method for determining an initial value of a priority order of columns included in the parity check matrix to be subjected to diagonalization process; and selects, from the plurality of methods, a method different from a previously selected method every time the priority order is initialized.

10. The decoding apparatus according to claim 6 wherein the means for carrying out the diagnalization process carries out a hard-decision diagonalization process by using the computed log likelihood ratios.

11. The decoding apparatus according to claim 6 wherein the means for carrying out the diagnalization process carries out a diagonalization process by using reliability levels obtained as a result of an updating process and by using an algebraic-geometry codes or codes of the same type as the algebraic-geometry codes in a finite field $F(q=p^m)$ where p is a prime number.

12. The decoding apparatus according to claim 11 wherein the algebraic-geometry codes are Reed-Solomon codes or BCH codes, and the means for carrying out the diagonalization process carries out a hard-decision list diagonalization process based on a Sudan or Gurusuwami-Sudan by taking reliability levels obtained as a result of an updating process.

13. The decoding apparatus according to claim 11 wherein the algebraic-geometry codes are Reed-Solomon codes or BCH codes, and the means for carrying out the diagonalization process carries out multiplicity-setting and soft-decision list decoding processes based on a Koetter-Vardy by taking reliability levels obtained as a result of an updating process.

14. A decoding method performed by a decoding apparatus for carrying out a decoding process on a ring-R linear code, the decoding method comprising:

acquiring a coded word having a code length that is reduced by omission of one or more symbols from the coded word and for holding the coded word in the decoding apparatus;

attaching, to the coded word, a reliability level corresponding to each of the omitted symbols, the reliability level including known information comprising known symbols, wherein each of the known symbols have a known value; and repeatedly carrying out a decoding process by using the decoding apparatus to perform belief propagation on the coded word and the attached known information.

15. A computer-readable storage medium storing a program executed on a processor to carry out a decoding process on a ring-R linear code, the decoding process comprising:

acquiring a coded word having a code length that is reduced by omission of one or more symbols from the coded word and for holding the coded word;

attaching, to the coded word, a reliability level corresponding to each of the omitted symbols, the reliability level including known information comprising known symbols, wherein each of the known symbols have a known value; and repeatedly carrying out a decoding process using belief propagation on the coded word and the attached known information.

16. A decoding apparatus for carrying out a decoding process on a ring-R linear code, the decoding apparatus comprising:

a coded-word holding section for acquiring a coded word having a code length that is reduced by omission of one or more symbols from the coded word and for holding the coded word;

a known-information addition section for attaching, to the coded word, a reliability level corresponding to each of the omitted symbols, the reliability level including known information comprising known symbols, wherein each of the known symbols have a known value; and a repetitive decoding section for repeatedly carrying out a decoding process using belief propagation on the coded word and the attached known information.

* * * * *